United States Patent
Rollin et al.

(10) Patent No.: US 9,306,255 B1
(45) Date of Patent: Apr. 5, 2016

(54) MICROSTRUCTURE INCLUDING MICROSTRUCTURAL WAVEGUIDE ELEMENTS AND/OR IC CHIPS THAT ARE MECHANICALLY INTERCONNECTED TO EACH OTHER

(71) Applicant: Nuvotronics, LLC, Radford, VA (US)

(72) Inventors: Jean-Marc Rollin, Blacksburg, VA (US); J. Robert Reid, Billerica, MA (US); David Sherrer, Radford, VA (US); Will Stacy, Blacksburg, VA (US); Ken Vanhille, Blacksburg, VA (US); J. Marcus Oliver, Blacksburg, VA (US); Tim Smith, Blacksburg, VA (US)

(73) Assignee: NUVOTRONICS, INC., Radford, VA (US)

( * ) Notice: Subject to any disclaimer, the term of this patent is extended or adjusted under 35 U.S.C. 154(b) by 0 days.

(21) Appl. No.: 14/211,749

(22) Filed: Mar. 14, 2014

Related U.S. Application Data

(60) Provisional application No. 61/798,018, filed on Mar. 15, 2013.

(51) Int. Cl.
| | |
|---|---|
| *H01P 1/04* | (2006.01) |
| *H01P 3/06* | (2006.01) |
| *H01P 5/00* | (2006.01) |
| *H01P 11/00* | (2006.01) |

(52) U.S. Cl.
CPC .... *H01P 1/045* (2013.01); *H01P 3/06* (2013.01); *H01P 5/00* (2013.01); *H01P 11/001* (2013.01)

(58) Field of Classification Search
CPC ........... H01P 3/06; H01P 1/042; H01P 1/045; H01P 3/12
USPC ............................................ 333/243, 245, 260
See application file for complete search history.

(56) References Cited

U.S. PATENT DOCUMENTS

| | | | |
|---|---|---|---|
| 2,743,505 A * | 5/1956 | Hill | 29/871 |
| 2,812,501 A | 11/1957 | Sommers | |
| 2,914,766 A | 11/1959 | Butler | |
| 2,997,519 A | 8/1961 | Hines | |
| 3,309,632 A | 3/1967 | Trudeau | |
| 3,311,966 A | 4/1967 | Henry | |
| 3,335,489 A | 8/1967 | Grant | |
| 3,352,730 A | 11/1967 | Murch | |
| 3,464,855 A | 9/1969 | Quintana | |
| 3,537,043 A | 10/1970 | Smith | |
| 3,560,896 A | 2/1971 | Essinger | |

(Continued)

FOREIGN PATENT DOCUMENTS

| | | |
|---|---|---|
| CA | 2055116 A1 | 5/1992 |
| DE | 3623093 A1 | 1/1988 |

(Continued)

OTHER PUBLICATIONS

Ali Darwish et al.; Vertical Balun and Wilkinson Divider; 2002 IEEE MTT-S Digest; pp. 109-112.

(Continued)

*Primary Examiner* — Benny Lee
(74) *Attorney, Agent, or Firm* — Niels Haun; Dann, Dorfman, Herrell & Skillman P.C.

(57) ABSTRACT

Structures and methods for interconnects and associated alignment and assembly mechanisms for and between chips, components, and 3D systems.

16 Claims, 25 Drawing Sheets

(56) References Cited

U.S. PATENT DOCUMENTS

| | | |
|---|---|---|
| 3,577,105 A | 5/1971 | Jones |
| 3,598,107 A | 8/1971 | Ishikawa |
| 3,760,306 A | 9/1973 | Spinner |
| 3,775,844 A | 12/1973 | Parks |
| 3,789,129 A | 1/1974 | Ditscheid |
| 3,791,858 A | 2/1974 | McPherson |
| 3,884,549 A | 5/1975 | Wang |
| 3,963,999 A | 6/1976 | Nakajima |
| 4,021,789 A | 5/1977 | Furman |
| 4,033,656 A | 7/1977 | Freehauf |
| 4,075,757 A | 2/1978 | Malm |
| 4,275,944 A | 6/1981 | Sochor |
| 4,348,253 A | 9/1982 | Subbarao |
| 4,365,222 A | 12/1982 | Lampert |
| 4,414,424 A | 11/1983 | Mizoguchi |
| 4,417,393 A | 11/1983 | Becker |
| 4,437,074 A | 3/1984 | Cohen |
| 4,521,755 A | 6/1985 | Carlson |
| 4,581,301 A | 4/1986 | Michaelson |
| 4,591,411 A | 5/1986 | Reimann |
| 4,641,140 A | 2/1987 | Heckaman |
| 4,663,497 A | 5/1987 | Reimann |
| 4,673,904 A | 6/1987 | Landis |
| 4,700,159 A | 10/1987 | Jones |
| 4,717,064 A | 1/1988 | Popielarski |
| 4,771,294 A | 9/1988 | Wasilousky |
| 4,808,273 A | 2/1989 | Hua |
| 4,832,461 A | 5/1989 | Yamagishi |
| 4,853,656 A | 8/1989 | Guillou |
| 4,856,184 A | 8/1989 | Doeling |
| 4,857,418 A | 8/1989 | Schuetz |
| 4,876,322 A | 10/1989 | Budde |
| 4,880,684 A | 11/1989 | Boss |
| 4,969,979 A | 11/1990 | Appelt |
| 4,975,142 A | 12/1990 | Iannacone |
| 5,069,749 A | 12/1991 | Gutierrez |
| 5,072,201 A | 12/1991 | Devaux |
| 5,100,501 A | 3/1992 | Blumenthal |
| 5,119,049 A | 6/1992 | Heller |
| 5,191,699 A | 3/1993 | Ganslmeier |
| 5,227,013 A | 7/1993 | Kumar |
| 5,235,208 A * | 8/1993 | Katoh ............ 257/691 |
| 5,274,484 A | 12/1993 | Mochizuki |
| 5,334,956 A | 8/1994 | Leding |
| 5,381,157 A | 1/1995 | Shiga |
| 5,406,235 A | 4/1995 | Hayashi |
| 5,406,423 A | 4/1995 | Sato |
| 5,430,257 A | 7/1995 | Lau |
| 5,454,161 A | 10/1995 | Beilin |
| 5,622,895 A | 4/1997 | Frank |
| 5,633,615 A | 5/1997 | Quan |
| 5,682,062 A | 10/1997 | Gaul |
| 5,682,124 A | 10/1997 | Suski |
| 5,712,607 A | 1/1998 | Dittmer |
| 5,724,012 A | 3/1998 | Teunisse |
| 5,746,868 A | 5/1998 | Abe |
| 5,793,272 A | 8/1998 | Burghartz |
| 5,814,889 A | 9/1998 | Gaul |
| 5,860,812 A | 1/1999 | Gugliotti |
| 5,872,399 A | 2/1999 | Lee |
| 5,925,206 A | 7/1999 | Boyko |
| 5,961,347 A | 10/1999 | Hsu |
| 5,977,842 A | 11/1999 | Brown |
| 5,990,768 A | 11/1999 | Takahashi |
| 6,008,102 A | 12/1999 | Alford |
| 6,027,630 A | 2/2000 | Cohen |
| 6,054,252 A | 4/2000 | Lundy |
| 6,180,261 B1 | 1/2001 | Inoue |
| 6,207,901 B1 * | 3/2001 | Smith et al. ............ 174/102 R |
| 6,210,221 B1 | 4/2001 | Maury |
| 6,228,466 B1 | 5/2001 | Tsukada |
| 6,294,965 B1 | 9/2001 | Merrill |
| 6,329,605 B1 | 12/2001 | Beroz |
| 6,350,633 B1 | 2/2002 | Lin |
| 6,388,198 B1 | 5/2002 | Bertin |
| 6,457,979 B1 | 10/2002 | Dove |
| 6,465,747 B2 | 10/2002 | DiStefano |
| 6,466,112 B1 | 10/2002 | Kwon |
| 6,514,845 B1 | 2/2003 | Eng |
| 6,518,165 B1 | 2/2003 | Yoon |
| 6,535,088 B1 | 3/2003 | Sherman |
| 6,589,594 B1 | 7/2003 | Hembree |
| 6,600,395 B1 | 7/2003 | Handforth |
| 6,603,376 B1 | 8/2003 | Handforth |
| 6,648,653 B2 | 11/2003 | Huang |
| 6,662,443 B2 | 12/2003 | Chou |
| 6,677,248 B2 | 1/2004 | Kwon |
| 6,735,009 B2 | 5/2004 | Li |
| 6,746,891 B2 | 6/2004 | Cunningham |
| 6,749,737 B2 | 6/2004 | Cheng |
| 6,800,360 B2 | 10/2004 | Miyanaga |
| 6,800,555 B2 | 10/2004 | Test |
| 6,827,608 B2 | 12/2004 | Hall |
| 6,850,084 B2 | 2/2005 | Hembree |
| 6,888,427 B2 | 5/2005 | Sinsheimer |
| 6,914,513 B1 | 7/2005 | Wahlers |
| 6,943,452 B2 | 9/2005 | Bertin |
| 6,971,913 B1 | 12/2005 | Chu |
| 6,975,267 B2 | 12/2005 | Stenger |
| 6,981,414 B2 | 1/2006 | Knowles |
| 7,005,750 B2 | 2/2006 | Liu |
| 7,012,489 B2 | 3/2006 | Sherrer |
| 7,030,712 B2 | 4/2006 | Brunette |
| 7,064,449 B2 | 6/2006 | Lin |
| 7,077,697 B2 | 7/2006 | Kooiman |
| 7,084,722 B2 | 8/2006 | Goyette |
| D530,674 S | 10/2006 | Ko |
| 7,129,163 B2 | 10/2006 | Sherrer |
| 7,148,141 B2 | 12/2006 | Shim |
| 7,148,722 B1 | 12/2006 | Cliff |
| 7,148,772 B2 | 12/2006 | Sherrer |
| 7,165,974 B2 | 1/2007 | Kooiman |
| 7,217,156 B2 | 5/2007 | Wang |
| 7,222,420 B2 | 5/2007 | Moriizumi |
| 7,239,219 B2 | 7/2007 | Brown |
| 7,252,861 B2 | 8/2007 | Smalley |
| 7,259,640 B2 | 8/2007 | Brown |
| 7,400,222 B2 | 7/2008 | Kwon |
| 7,405,638 B2 | 7/2008 | Sherrer |
| 7,449,784 B2 | 11/2008 | Sherrer |
| 7,478,475 B2 | 1/2009 | Hall |
| 7,508,065 B2 | 3/2009 | Sherrer |
| 7,532,163 B2 | 5/2009 | Chang |
| 7,555,309 B2 | 6/2009 | Baldor |
| 7,575,474 B1 | 8/2009 | Dodson |
| 7,579,553 B2 | 8/2009 | Moriizumi |
| 7,602,059 B2 | 10/2009 | Nobutaka |
| 7,619,441 B1 | 11/2009 | Rahman |
| 7,645,940 B2 | 1/2010 | Shepherd |
| 7,649,432 B2 | 1/2010 | Sherrer |
| 7,656,256 B2 | 2/2010 | Houck |
| 7,658,831 B2 | 2/2010 | Mathieu |
| 7,683,842 B1 | 3/2010 | Engel |
| 7,705,456 B2 | 4/2010 | Hu |
| 7,755,174 B2 | 7/2010 | Rollin |
| 7,898,356 B2 | 3/2011 | Sherrer |
| 7,948,335 B2 | 5/2011 | Sherrer |
| 8,011,959 B1 | 9/2011 | Tsai |
| 8,031,037 B2 | 10/2011 | Sherrer |
| 8,188,932 B2 | 5/2012 | Worl |
| 8,264,297 B2 | 9/2012 | Thompson |
| 8,304,666 B2 | 11/2012 | Ko |
| 8,339,232 B2 | 12/2012 | Lotfi |
| 8,441,118 B2 | 5/2013 | Hua |
| 8,522,430 B2 | 9/2013 | Kacker |
| 8,542,079 B2 | 9/2013 | Sherrer |
| 8,674,872 B2 | 3/2014 | Billaud |
| 8,742,874 B2 | 6/2014 | Sherrer |
| 2002/0075104 A1 | 6/2002 | Kwon |
| 2003/0029729 A1 | 2/2003 | Cheng |
| 2003/0052755 A1 | 3/2003 | Barnes |
| 2003/0117237 A1 | 6/2003 | Niu |
| 2003/0221968 A1 | 12/2003 | Cohen |
| 2003/0222738 A1 | 12/2003 | Brown |

(56) References Cited

U.S. PATENT DOCUMENTS

| | | |
|---|---|---|
| 2004/0000701 A1 | 1/2004 | White |
| 2004/0004061 A1 | 1/2004 | Merdan |
| 2004/0007468 A1 | 1/2004 | Cohen |
| 2004/0007470 A1 | 1/2004 | Smalley |
| 2004/0038586 A1 | 2/2004 | Hall |
| 2004/0076806 A1 | 4/2004 | Miyanaga |
| 2004/0124961 A1 | 7/2004 | Aoyagi |
| 2004/0196112 A1 | 10/2004 | Welbon |
| 2004/0263290 A1 | 12/2004 | Sherrer |
| 2005/0030124 A1 | 2/2005 | Okamoto |
| 2005/0045484 A1 | 3/2005 | Smalley |
| 2005/0156693 A1 | 7/2005 | Dove |
| 2005/0230145 A1 | 10/2005 | Ishii |
| 2005/0250253 A1 | 11/2005 | Cheung |
| 2008/0191817 A1 | 8/2008 | Sherrer |
| 2008/0197946 A1 | 8/2008 | Houck |
| 2008/0199656 A1 | 8/2008 | Nichols |
| 2008/0240656 A1 | 10/2008 | Rollin |
| 2008/0246562 A1* | 10/2008 | Sherrer et al. ............... 333/260 |
| 2009/0051476 A1 | 2/2009 | Tada |
| 2009/0154972 A1 | 6/2009 | Tanaka |
| 2010/0007016 A1 | 1/2010 | Oppermann |
| 2010/0015850 A1 | 1/2010 | Stein |
| 2010/0109819 A1 | 5/2010 | Houck |
| 2010/0225435 A1 | 9/2010 | Li |
| 2010/0296252 A1 | 11/2010 | Rollin |
| 2011/0123783 A1 | 5/2011 | Sherrer |
| 2011/0181376 A1 | 7/2011 | Vanhille |
| 2011/0181377 A1 | 7/2011 | Vanhille |
| 2011/0210807 A1 | 9/2011 | Sherrer |
| 2011/0273241 A1 | 11/2011 | Sherrer |
| 2013/0050055 A1 | 2/2013 | Paradiso |
| 2013/0127577 A1 | 5/2013 | Lotfi |

FOREIGN PATENT DOCUMENTS

| | | |
|---|---|---|
| EP | 0398019 | 4/1990 |
| EP | 0485831 A1 | 5/1992 |
| EP | 0845831 A2 | 6/1998 |
| EP | 0911903 A2 | 4/1999 |
| FR | 2086327 A1 | 12/1971 |
| GB | 2265754 | 10/1993 |
| JP | H027587 A | 1/1990 |
| JP | 3027587 | 2/1991 |
| JP | H041710 A | 1/1992 |
| JP | H0685510 A | 3/1994 |
| JP | H06302964 A | 10/1994 |
| JP | H10041710 | 2/1998 |
| JP | 200667621 | 3/2006 |
| TW | I244799 | 12/2005 |
| WO | 0007218 A2 | 2/2000 |
| WO | 0039854 A1 | 7/2000 |
| WO | 0206152 | 1/2002 |
| WO | 0206152 A2 | 1/2002 |
| WO | 02080279 A1 | 10/2002 |
| WO | 2004004061 | 1/2004 |
| WO | 2010111455 | 9/2010 |

OTHER PUBLICATIONS

Brown et al., 'A Low-Loss Ka-Band Filter in Rectangular Coax Made by Electrochemical Fabrication', submitted to Microwave and Wireless Components Letters, date unknown {downloaded from www.memgen.com, 2004).

Chance, G.I. et al., "A suspended-membrane balanced frequency doubler at 200GHz," 29th International Conference on Infrared and Millimeter Waves and Terahertz Electronics, pp. 321-322, Karlsrube, 2004.

Chwomnawang et al., 'On-chip 3D Air Core Micro-Inductor for High-Frequency Applications Using Deformation of Sacrificial Polymer', Proc. SPIE, vol. 4334, pp. 54-62, Mar. 2001.

Colantonio, P., et al., "High Efficiency RF and Microwave Solid State Power Amplifiers," pp. 380-395, 2009.

Cole, B.E., et al., Micromachined Pixel Arrays Integrated with CMOS for Infrared Applications, pp. 64-64 (2000).

De Los Santos, H.J., Introduction to Microelectromechanical (MEM) Microwave Systems {pp. 4, 7-8, 13) (1999).

Deyong, C, et al., A Microstructure Semiconductor Thermocouple for Microwave Power Sensors, 1997 Asia Pacific Microwave Conference, pp. 917-919.

Ehsan, N., "Broadband Microwave Litographic 3D Components," Dissertation 2009.

Ehsan, N. et al., "Microcoaxial lines for active hybrid-monolithic circuits," 2009 IEEE MTT-S Int. Microwave.Symp. Boston, MA, Jun. 2009.

Elliott Brown/MEMGen Corporation, 'RF Applications of EFAB Technology', MTT-S IMS 2003, pp. 1-15.

Engelmann et al., 'Fabrication of High Depth-to-Width Aspect Ratio Microstructures', IEEE Micro Electro Mechanical Systems (Feb. 1992), pp. 93-98.

European Examination Report dated Mar. 21, 2013 for EP Application No. 07150463.3.

European Examination Report of corresponding European Patent Application No. 08 15 3144 dated Apr. 6, 2010.

European Examination Report of corresponding European Patent Application No. 08 15 3144 dated Feb. 22, 2012.

European Examination Report of corresponding European Patent Application No. 08 15 3144 dated Nov. 10, 2008.

European Search Report for corresponding EP Application No. 07150463.3 dated Apr. 23, 2012.

European Search Report of Corresponding European Application No. 07 15 0467 mailed Apr. 28, 2008.

European Search Report of corresponding European Application No. 08 15 3138 mailed Jul. 4, 2008.

European Search Report of corresponding European Application No. 08153138.6 mailed Jul. 15, 2008.

European Search Report of corresponding European Patent Application No. 08 15 3144 dated Jul. 2, 2008.

Filipovic, D. et al., "Monolithic rectangular coaxial lines. Components and systems for commercial and defense applications," Presented at 2008 IASTED Antennas, Radar, and Wave Propagation Conferences, Baltimore, MD, USA, Apr. 2008.

Filipovic, D.S., "Design of microfabricated rectangular coaxial lines and components for mm-wave applications," Microwave Review, vol. 12, No. 2, Nov. 2006, pp. 11-16.

Filipovic et al.; 'Modeling, Design, Fabrication, and Performance of Rectangular .mu.-Coaxial Lines and Components'; Microwave Symposium Digest, 2006, IEEE; Jun. 1, 2006; pp. 1393-1396.

Franssila, S., Introduction to Microfabrication, (pp. 8) (2004).

Frazier et al., 'M ET ALlic Microstructures Fabricated Using Photosensitive Polyimide Electroplating Molds', Journal of Microelectromechanical Systems, vol. 2, No. 2, Jun. 1993, pp. 87-94.

Ghodisian, B., et al., Fabrication of Affordable M ET ALlic Microstructures by Electroplating and Photoresist Molds, 1996, pp. 68-71.

H. Guckel, 'High-Aspect-Ratio Micromachining Via Deep X-Ray Lithography', Proc. of IEEE, vol. 86, No. 8 (Aug. 1998), pp. 1586-1593.

Hawkins, C.F., The Microelectronics Failure Analysis, Desk Reference Edition (2004).

Immorlica, Jr., T. et al., "Miniature 3D micro-machined solid state power amplifiers," COMCAS 2008.

Ingram, D.L. et al., "A 427 mW 20% compact W-band InP HEMT MMIC power amplifier," IEEE RFIC Symp. Digest 1999, pp. 95-98.

International Preliminary Report on Patentability dated Jul. 24, 2012 for corresponding PCT/US2011/022173.

International Preliminary Report on Patentability dated May 19, 2006 on corresponding PCT/US04/06665.

International Search Report dated Aug. 29, 2005 on corresponding PCT/US04/06665.

Jeong, I., et al., "High Performance Air-Gap Transmission Lines and Inductors for Milimeter-Wave Applications", Transactions on Microwave Theory and Techniques, vol. 50, No. 12, Dec. 2002.

(56) References Cited

OTHER PUBLICATIONS

Jeong, Inho et al., 'High-Performance Air-Gap Transmission Lines and Inductors for Millimeter-Wave Applications', IEEE Transactions on Microwave Theory and Techniques, Dec. 2002, pp. 2850-2855, vol. 50, No. 12.
Katehi et al., 'MEMS and Si Micromachined Circuits for High-Frequency Applications', IEEE Transactions on Microwave Theory and Techniques, vol. 50, No. 3, Mar. 2002, pp. 858-866.
Kenneth J. Vanhille et al.; Micro-Coaxial Imedance Transformers; Journal of Latex Class Files; vol. 6; No. 1; Jan. 2007.
Kwok, P.Y., et al., Fluid Effects in Vibrating Micromachined Structures, Journal of Microelectromechanical Systems, vol. 14, No. 4, Aug. 2005, pp. 770-781.
Lee et al., 'Micromachining Applications of a High Resolution Ultrathick Photoresist', J. Vac. Sci. Technol. B 13 (6), Nov./Dec. 1995, pp. 3012-3016.
Loechel et al., 'Application of Ultraviolet Depth Lithography for Surface Micromachining', J. Vac. Sci. Technol. B 13 (6), Nov./Dec. 1995, pp. 2934-2939.
Lukic, M. et al., "Surface-micromachined dual Ka-band cavity backed patch antennas," IEEE Trans. AtennasPropag., vol. 55, pp. 2107-2110, Jul. 2007.
Madou, M.J., Fundamentals of Microfabrication: The Science of Miniaturization, 2d Ed., 2002 (Roadmap; pp. 615-668).
Oliver, J.M. et al., "A 3-D micromachined W-band cavity backed patch antenna array with integrated rectacoax transition to wave guide," 2009 Proc. IEEE International Microwave Symposium, Boston, MA 2009.
Park et al., 'Electroplated Micro-Inductors and Micro-Transformers for Wireless application', IMAPS 2002, Denver, CO, Sep. 2002.
PwrSoC Update 2012: Technology, Challenges, and Opportunities for Power Supply on Chip, Presentation (Mar. 18, 2013).
Rollin, J.M. et al., "A membrane planar diode for 200GHz mixing applications," 29th International Conference on Infrared and Millimeter Waves and Terahertz Electronics, pp. 205-206, Karlsrube, 2004.
Rollin, J.M. et al., "Integrated Schottky diode for a sub-harmonic mixer at millimetre wavelengths," 31st International Conference on Infrared and Millimeter Waves and Terahertz Electronics, Paris, 2006.
Saito, Y., Fontaine, D., Rollin, J-M., Filipovic, D., 'Micro-Coaxial Ka-Band Gysel Power Dividers,' Microwave Opt Technol Lett 52: 474-478, 2010, Feb. 2010.
Saito et al., "Analysis and design of monolithic rectangular coaxial lines for minimum coupling," IEEE Trans. Microwave Theory Tech., vol. 55, pp. 2521-2530, Dec. 2007.
Sedky, S., Post-Processing Techniques for Integrated MEMS (pp. 9, 11, 164) (2006).
Sherrer, D, Vanhille, K, Rollin, J.M., 'PolyStrata Technology: A Disruptive Approach for 3D Microwave Components and Modules,' Presentation (Apr. 23, 2010).
Tummala et al.; 'Microelectronics Packaging Handbook'; Jan. 1, 1989; XP002477031; pp. 710-714.
Vanhille, K., 'Design and Characterization of Microfabricated Three-Dimensional Millimeter-Wave Components,' Dissertation, 2007.
Vanhille, K. et al., 'Balanced low-loss Ka-band-coaxial hybrids,' IEEE MTT-S Dig., Honolulu, Hawaii, Jun. 2007.
Vanhille, K. et al., "Ka-Band surface mount directional coupler fabricated using micro-rectangular coaxial transmission lines," 2008 Proc. IEEE International Microwave Symposium, 2008.
Vanhille, K.J. et al., "Ka-band miniaturized quasi-planar high-Q resonators," IEEE Trans. Microwave Theory Tech., vol. 55, No. 6, pp. 1272-1279, Jun. 2007.
Vyas R. et al., "Liquid Crystal Polymer (LCP): The ultimate solution for low-cost RF flexible electronics and antennas," Antennas and Propagation Society, International Symposium, p. 1729-1732 (2007).
Wang, H. et al., "Design of a low integrated sub-harmonic mixer at 183GHz using European Schottky diode technology," From Proceedings of the 4th ESA workshop on Millimetre-Wave Technology and Applications, pp. 249-252, Espoo, Finland, Feb. 2006.
Wang, H. et al., "Power-amplifier modules covering 70-113 GHz using MMICs,"IEEE Trans Microwave Theory and Tech., vol. 39, pp. 9-16, Jan. 2001.
Written Opinion of the International Searching Authority dated Aug. 29, 2005 on corresponding PCT/US04/06665.
Yeh, J.L., et al., Copper-Encapsulated Silicon Micromachined Structures, Journal of Microelectromechanical Systems, vol. 9, No. 3, Sep. 2000, pp. 281-287.
Yoon et al., '3-D Lithography and METAL Surface Micromachining for RF and Microwave MEMs' IEEE MEMS 2002 Conference, Las Vegas, NV, Jan. 2002, pp. 673-676.
Yoon et al., 'CMOS-Compatible Surface Micromachined Suspended-Spiral Inductors for Multi-GHz Sillicon RF lcs', IEEE Electron Device Letters, vol. 23, No. 10, Oct. 2002, pp. 591-593.
Yoon et al., 'High-Performance Electroplated Solenoid-Type Integrated Inductor (SI2) for RF Applications Using Simple 3D Surface Micromachining Technology', Int'l Election Devices Meeting, 1998, San Francisco, CA, Dec. 6-9, 1998, pp. 544-547.
Yoon et al., 'High-Performance Three-Dimensional On-Chip Inductors Fabricated by Novel Micromahining Technology for RF MMIC', 1999 IEEE MTT-S Int'l Microwave Symposium Digest, vol. 4, Jun. 13-19, 1999, Anaheim, California, pp. 1523-1526.
Yoon et al., 'Monolithic High-Q Overhang Inductors Fabricated on Silicon and Glass Substrates', International Electron Devices Meeting, Washington D.C. (Dec. 1999), pp. 753-756.
Yoon et al., 'Monolithic Integration of 3-D Electroplated Microstructures with Unlimited Number of Levels Using Planarization with a Sacrificial METALlic Mole (PSMm)', Twelfth IEEE Int'l Conf. on Micro Electro mechanical systems, Orlando Florida, Jan. 1999, pp. 624-629.
Yoon et al., 'Multilevel Microstructure Fabrication Using Single-Step 3D Photolithography and Single-Step Electroplating', Proc. of SPIE, vol. 3512, (Sep. 1998), pp. 358-366.
Yoon et al., "High-Performance Electroplated Solenoid-Type Integrated Inductor (S12) for RF Applications Using Simple 3D Surface Micromachining Technology", Int'l Election Devices Meeting, 1998, San Francisco, CA, Dec. 6-9, 1998, pp. 544-547.
International Search Report corresponding to PCT/US12/46734 dated Nov. 20, 2012.
Written Opinion corresponding to PCT/US12/46734 dated Nov. 20, 2012.
N. Ehsan, K.J. Vanhille, S. Rondineau, Z. Popovic, "Micro-coaxial impedance transformers," IEEE Trans. Microwave Theory Tech., Nov. 2010, pp. 2908-2914.
N. Ehsan, K. Vanhille, S. Rondineau, E. Cullens, Z. Popovic, "Broadband Wilkinson Dividers," IEEE Trans. Microwave Theory Tech., Nov. 2009, pp. 2783-2789.
Y. Saito, J.R. Mruk, J.-M. Rollin, D.S. Filipovic, "X-through Q-band log-periodic antenna with monolithically integrated u-coaxial impedence transformer/feeder, " Electronic Letts. Jul. 2009, pp. 775-776.
M. V. Lukic, and D. S. Filipovic, "Surface-micromachined dual Ka- and cavity backed patch antenna," IEEE Trans. Antennas Propag., vol. 55, No. 7, pp. 2107-2110, Jul. 2007.
M. V. Lukic, and D. S. Filipovic, "Modeling of 3-D Surface Roughness Effects With Application to µ-Coaxial Lines," IEEE Trans. Microwave Theory Tech., Mar. 2007, pp. 518-525.
K. J. Vanhille, D. L. Fontaine, C. Nichols, D. S. Filipovic, and Z. Popovic, "Quasi-planar high-Q millimeter-wave resonators," IEEE Trans. Microwave Theory Tech., vol. 54, No. 6, pp. 2439-2446, Jun. 2006.
M. Lukic, S. Rondineau, Z. Popovic, D. Filipovic, "Modeling of realistic rectangular µ-coaxial lines" IEEE Trans. Microwave Theory Tech., vol. 54, No. 5, pp. 2068-2076, May 2006.
H. Zhou, N.A. Sutton, D. S. Filipovic, "W-band endfire log periodic dipole array," Proc. IEEE-APS/URSI Symposium, Spokane, WA, Jul. 2011, pp. 1233-1236.
T.E. Durham, "An 8-40GHz Wideband Instrument for Snow Measurements," Earth Science Technology Forum, Pasadena, CA, Jun. 2011.

(56) References Cited

OTHER PUBLICATIONS

J. M. Oliver, P. E. Ralston, E. Cullens, L. M. Ranzani, S. Raman, K. Vanhille, "A W-band Micro-coaxial Passive Monopulse Comparator Network with Integrated Cavity-Backed Patch Antenna Array," 2011 IEEE MTT-S Int. Microwave, Symp., Baltimore, MD, Jun. 2011.

H. Zhou, N. A. Sutton, D. S. Filipovic, "Wideband W-band patch antenna," 5th European Conference on Antennas and Propagation, Rome, Italy, Apr. 2011, pp. 1518-1521.

N. Sutton, D.S. Filipovic, "Design of a K-thru Ka-band modified Butler matrix feed for a 4-arm spiral antenna," 2010 Loughborough Antennas and Propagation Conference, Loughborough, UK, Nov. 2010, pp. 521-524.

E. Cullens, K. Vanhille, Z. Popovic, "Miniature bias-tee networks integrated in microcoaxial lines," in Proc. 40th European Microwave Conf., Paris, France, Sep. 2010, pp. 413-416.

D. Filipovic, G. Potvin, D. Fontaine, Y. Saito, J.-M. Rollin, Z. Popovic, M. Lukic, K. Vanhille, C. Nichols,"μ-coaxial phased arrays for Ka-Band Communications," Antenna Applications Symposium, Monticello, IL, Sep. 2008, pp. 104-115.

J.R. Reid, D. Hanna, R.T. Webster, "A 40/50 GHz diplexer realized with three dimensional copper micromachining," in 2008 IEEE MTT-S Int. Microwave Symp., Atlanta, GA, Jun. 2008, pp. 1271-1274.

A.A. Immorlica Jr., R. Actis, D. Nair, K. Vanhille, C. Nichols, J.-M. Rollin, D. Fleming, R. Varghese, D. Sherrer, D. Filipovic, E. Cullens, N. Ehsan, and Z. Popovic, "Miniature 3D micromachined solid state amplifiers," in 2008 IEEE International Conference on Microwaves, Communications, Antennas, and Electronic Systems, Tel-Aviv, Israel, May 2008, pp. 1-7.

M. Lukic, K. Kim, Y. Lee, Y. Saito, and D. S. Filipovic, "Multi-physics design and performance of a surface micromachined Ka-band cavity backed patch antenna," 2007 SBMO/IEEE Int. Microwave and Optoelectronics Conf., Oct. 2007, pp. 321-324.

M. V. Lukic, and D. S. Filipovic, "Integrated cavity-backed ka-band phased array antenna," Proc. IEEE-APS/URSI Symposium, Jun. 2007, pp. 133-135.

M. Lukic, D. Fontaine, C. Nichols, D. Filipovic, "Surface micromachined Ka-band phased array antenna," Presented at Antenna Applic. Symposium, Monticello, IL, Sep. 2006.

D. Filipovic, Z. Popovic, K. Vanhille, M. Lukic, S. Rondineau, M. Buck, G. Potvin, D. Fontaine, C. Nichols, D. Sherrer, S. Zhou, W. Houck, D. Fleming, E. Daniel, W. Wilkins, V. Sokolov, E. Adler, and J. Evans, "Quasi-planar rectangular ¼-coaxial structures for mm-wave applications," Proc. GomacTech., pp. 28-31, San Diego, Mar. 2006.

M. Lukic, D. Filipovic, "Modeling of surface roughness effects on the performance of rectangular μ-coaxial lines," Proc. 22nd Ann. Rev. Prog. Applied Comp. Electromag. (ACES), pp. 620-625, Miami, Mar. 2006.

J. R. Mruk, N. Sutton, D. S. Filipovic, "Micro-coaxial fed 18 to 110 GHz planar log-periodic Antennas with RF transitions," IEEE Trans. Antennas Propag., vol. 62, No. 2, Feb. 2014, pp. 968-972.

N. Jastram, D. S. Filipovic, "PCB-based prototyping of 3-D micromachined RF subsystems," IEEE Trans. Antennas Propag., vol. 62, No. 1, Jan. 2014. pp. 420-429.

L. Ranzani, D. Kuester, K. J. Vanhille, A Boryssenko, E. Grossman, Z. Popovic, "G-Band micro-fabricated frequency-steered arrays with 2° /GHz beam steering," IEEE Trans. on Terahertz Science and Technology, vol. 3, No. 5, Sep. 2013.

L. Ranzani, E. D. Cullens, D. Kuester, K. J. Vanhille, E. Grossman, Z. Popovic, "W-band micro-fabricated coaxially-fed frequency scanned slot arrays," IEEE Trans. Antennas Propag., vol. 61, No. 4, Apr. 2013.

H. Zhou, N. A. Sutton, D. S. Filipovic, "Surface micromachined millimeter-wave log-periodic dipole array antennas," IEEE Trans. Antennas Propag., Oct. 2012, vol. 60, No. 10, pp. 4573-4581.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Journal of Solid-State Circuits, Oct. 2012, vol. 47, No. 10, pp. 2327-2334.

N.A. Sutton, J.M. Oliver, D.S. Filipovic, "Wideband 18-40 GHz surface micromachined branchline quadrature hybrid," IEEE Microwave and Wireless Components Letters, Sep. 2012, vol. 22, No. 9, pp. 462-464.

E. Cullens, L. Ranzani, K. Vanhille, E. Grossman, N. Ehsan, Z. Popovic, "Micro-Fabricated 130-180 GHz frequency scanning waveguide arrays," IEEE Trans. Antennas Propag., Aug. 2012, vol. 60, No. 8, pp. 3647-3653.

Mruk, J.R., Filipovic, D.S, "Micro-coaxial V-/W-band filters and contiguous diplexers," Microwaves, Antennas & Propagation, IET, Jul. 17, 2012, vol. 6, issue 10, pp. 1142-1148.

J. M. Oliver, J.-M. Rollin, K. Vanhille, S. Raman, "A W-band micromachined 3-D cavity-backed patch antenna array with integrated diode detector," IEEE Trans. Microwave Theory Tech., Feb. 2012, vol. 60, No. 2, pp. 284-292.

Mruk, J.R., Saito, Y., Kim, K., Radway, M., Filipovic, D.S., "Directly fed millimetre-wave two-arm spiral antenna," Electronics Letters, Nov. 25, 2010, vol. 46, issue 24, pp. 1585-1587.

Y. Saito, M.V. Lukic, D. Fontaine, J.-M. Rollin, D.S. Filipovic, "Monolithically Integrated Corporate-Fed Cavity-Backed Antennas," IEEE Trans. Antennas Propag., vol. 57, No. 9, Sep. 2009, pp. 2583-2590.

Y. Saito, D. Fontaine, J.-M. Rollin, D.S. Filipovic, "Monolithic micro-coaxial power dividers," Electronic Letts., Apr. 2009, pp. 469-470.

D.S. Filipovic, M. Lukic, Y. Lee and D. Fontaine, "Monolithic rectangular coaxial lines and resonators with embedded dielectric support," IEEE Microwave and Wireless Components Letters, vol. 18, No. 11, pp. 740-742, 2008.

D. Sherrer, "Improving electronics\ functional density," MICROmanufacturing, May/Jun. 2015, pp. 16-18.

T. Durham, H.P. Marshall, L. Tsang, P. Racette, Q. Bonds, F. Miranda, K. Vanhille, "Wideband sensor technologies for measuring surface snow," Earthzine, Dec. 2013, [online: http://www.earthzine.org/2013/12/02/wideband-sensor-technologies-for-measuring-surface-snow/].

S. Huettner, "High Performance 3D Micro-Coax Technology," Microwave Journal, Nov. 2013. [online: http://www.microwavejournal.com/articles/21004-high-performance-3d-micro-coax-technology].

S. Huettner, "Transmission lines withstand vibration," Microwaves and RF, Mar. 2011. [online: http://mwrf.com/passive-components/transmission-lines-withstand-vibration].

Z. Popovic, S. Rondineau, D. Filipovic, D. Sherrer, C. Nichols, J.-M. Rollin, and K. Vanhille, "An enabling new 3D architecture for microwave components and systems," Microwave Journal, Feb. 2008, pp. 66-86.

"Shiffman phase shifters designed to work over a 15-45GHz range," phys.org, Mar. 2014. [online: http://phys.org/wire-news/156496085/schiffman-phase-shifters-designed-to-work-over-a-15-45ghz-range.html].

B. Cannon, K. Vanhille, "Microfabricated Dual-Polarized, W-band Antenna Architecture for Scalable Line Array Feed," 2015 IEEE Antenna and Propagation Symposium, Vancouver, Canada, Jul. 2015.

T. E. Durham, C. Trent, K. Vanhille, K. M. Lambert, F. A. Miranda, "Design of an 8-40 GHz Antenna for the Wideband Instrument for Snow Measurements (WISM)," 2015 IEEE Antenna and Propagation Symposium, Vancouver, Canada, Jul. 2015.

K. M. Lambert, F. A. Miranda, R. R. Romanofsky, T. E. Durham, K. J. Vanhille, "Antenna characterization for the Wideband Instrument for Snow Measurements (WISM)," 2015 IEEE Antenna and Propagation Symposium, Vancouver, Canada, Jul. 2015.

T. Liu, F. Houshmand, C. Gorle, S. Scholl, H. Lee, Y. Won, H. Kazemi, K. Vanhille, M. Asheghi, K. Goodson, "Full-Scale Simulation of an Integrated Monolithic Heat Sink for Thermal Management of a High Power Density GaN—SiC Chip," InterPACK/ICNMM, San Francisco, CA, Jul. 2015.

S. Scholl, C. Gorle, F. Houshmand, T. Liu, H. Lee, Y. Won, H. Kazemi, M. Asheghi, K. Goodson, "Numerical Simulation of Advanced Monolithic Microcooler Designs for High Heat Flux Microelectronics," InterPACK, San Francisco, CA, Jul. 2015.

(56) References Cited

OTHER PUBLICATIONS

S. Scholl, C. Gorle, F. Houshmand, T. Verstraete, M. Asheghi, K. Goodson, "Optimization of a microchannel geometry for cooling high heat flux microelectronics using numerical methods," InterPACK, San Francisco, CA, Jul. 2015.

K. Vanhille, T. Durham, W. Stacy, D. Karasiewicz, A. Caba, C. Trent, K. Lambert, F. Miranda, "A microfabricated 8-40 GHz dual-polarized reflector feed," 2014 Antenna Applications Symposium, Monticello, IL, Sep. 2014. pp. 241-257.

A. Boryssenko, J. Arroyo, R. Reid, M.S. Heimbeck, "Substrate free G-band Vivaldi antenna array design, fabrication and testing" 2014 IEEE International Conference on Infrared, Millimeter, and Terahertz Waves, Tucson, Sep. 2014.

A. Boryssenko, K. Vanhille, "300-GHz microfabricated waveguide slotted arrays" 2014 IEEE International Conference on Infrared, Millimeter, and Terahertz Waves, Tucson, Sep. 2014.

N. Chamberlain, M. Sanchez Barbetty, G. Sadowy, E. Long, K. Vanhille, "A dual-polarized metal patch antenna element for phased array applications," 2014 IEEE Antenna and Propagation Symposium, Memphis, Jul. 2014. pp. 1640-1641.

L. Ranzani, I. Ramos, Z. Popovic, D. Maksimovic, "Microfabricated transmission-line transformers with DC isolation," URSI National Radio Science Meeting, Boulder, CO, Jan. 2014.

N. Jastram, D. S. Filipovic, "Parameter study and design of W-band micromachined tapered slot antenna," Proc. IEEE-APS/URSI Symposium, Orlando, FL, Jul. 2013, pp. 434-435.

J.M. Oliver, H. Kazemi, J.-M. Rollin, D. Sherrer, S. Huettner, S. Raman, "Compact, low-loss, micromachined rectangular coaxial millimeter-wave power combining networks," 2013 IEEE MTT-S Int. Microwave, Symp., Seattle, WA, Jun. 2013.

N. Jastram, D. Filipovic, "Monolithically integrated K/Ka array-based direction finding subsystem," Proc. IEEE-APS/URSI Symposium, Chicago, IL, Jul. 2012, pp. 1-2.

N.A. Sutton, D. S. Filipovic, "V-band monolithically integrated four-arm spiral antenna and beamforming network," Proc. IEEE-APS/URSI Symposium, Chicago, IL, Jul. 2012, pp. 1-2.

P. Ralston, K. Vanhille, A. Caba, M. Oliver, S. Raman, "Test and verification of micro coaxial line power performance," 2012 IEEE MTT-S Int. Microwave, Symp., Montreal, Canada, Jun. 2012.

N.A. Sutton, J. M. Oliver, D. S. Filipovic, "Wideband 15-50 GHz symmetric multi-section coupled line quadrature hybrid based on surface micromachining technology," 2012 IEEE MTT-S Int. Microwave, Symp., Montreal, Canada, Jun. 2012.

J.R. Reid, J.M. Oliver, K. Vanhille, D. Sherrer, "Three dimensional metal micromachining: A disruptive technology for millimeter-wave filters," 2012 IEEE Topical Meeting on Silicon Monolithic Integrated Circuits in RF Systems, Jan. 2012.

P. Ralston, M. Oliver, K. Vummidi, S. Raman, "Liquid-metal vertical interconnects for flip chip assembly of GaAs C-band power amplifiers onto micro-rectangular coaxial transmission lines," IEEE Compound Semiconductor Integrated Circuit Symposium, Oct. 2011.

J.R. Mruk, Y. Saito, K. Kim, M. Radway, D. Filipovic, "A directly fed Ku-to W-band 2-arm Archimedean spiral antenna," Proc. 41st European Microwave Conf., Oct. 2011, pp. 539-542.

E. Cullens, L. Ranzani, E. Grossman, Z. Popovic, "G-Band Frequency Steering Antenna Array Design and Measurements," Proceedings of the URSI General Assembly, Istanbul, Turkey, Aug. 2011.

J. R. Mruk, H. Zhou, H. Levitt, D. Filipovic, "Dual wideband monolithically integrated millimeter-wave passive front-end subsystems," in 2010 Int. Conf. on Infrared, Millimeter and Terahertz Waves, Sep. 2010, pp. 1-2.

Z. Popovic, "Micro-coaxial micro-fabricated feeds for phased array antennas," in IEEE Int. Symp. on Phased Array Systems and Technology, Waltham, MA, Oct. 2010, pp. 1-10. (Invited).

L. Ranzani, N. Ehsan, Z. Popovi‡, "G-band frequency-scanned antenna arrays," 2010 IEEE APS-URSI International Symposium, Toronto, Canada, Jul. 2010.

J. Mruk, Z. Hongyu, M. Uhm, Y. Saito, D. Filipovic, "Wideband mm-Wave Log-Periodic Antennas," 3rd European Conference on Antennas and Propagation, pp. 2284-2287, Mar. 2009.

Z. Popovic, K. Vanhille, N. Ehsan, E. Cullens, Y. Saito, J.-M. Rollin, C. Nichols, D. Sherrer, D. Fontaine, D. Filipovic, "Micro-fabricated micro-coaxial millimeter-wave components," in 2008 Int. Conf. on Infrared, Millimeter and Terahertz Waves, Pasadena, CA, Sep. 2008, pp. 1-3.

K. Vanhille, M. Lukic, S. Rondineau, D. Filipovic, and Z. Popovic, "Integrated micro-coaxial passive components for millimeter-wave antenna front ends," 2007 Antennas, Radar, and Wave Propagation Conference, May 2007.

D. Filipovic, G. Potvin, D. Fontaine, C. Nichols, Z. Popovic, S. Rondineau, M. Lukic, K. Vanhille, Y. Saito, D. Sherrer, W. Wilkins, E. Daniels, E. Adler, and J. Evans, "Integrated micro-coaxial Ka-band antenna and array," GomacTech 2007 Conference, Mar. 2007.

K. Vanhille, M. Buck, Z. Popovic, and D.S. Filipovic, "Miniature Ka-band recta-coax components: analysis and design," presented at 2005 AP-S/URSI Symposium, Washington, DC, Jul. 2005.

K. Vanhille, "Design and Characterization of Microfabricated Three-Dimensional Millimeter-Wave Components," Thesis, 2007.

N. Ehsan, "Broadband Microwave Lithographic 3D Components," Thesis, 2009.

J. Oliver, "3D Micromachined Passive Components and Active Circuit Integration For Millimeter-Wave Radar Applications," Thesis, Feb. 10, 2011.

J. Mruk, "Wideband Monolithically Integrated Front-End Subsystems and Components," Thesis, 2011.

E. Cullens, "Microfabricated Broadband Components for Microwave Front Ends," Thesis, 2011.

N. Jastram, "Design of a Wideband Millimeter Wave Micromachined Rotman Lens," IEEE Transactions on Antennas and Propagation, vol. 63, No. 6, Jun. 2015.

N. Jastram, "Wideband Millimeter-Wave Surface Micromachined Tapered Slot Antenna," IEEE Antennas and Wireless Propagation Letters, vol. 13, 2014.

H. Kazemi, "350mW G-band Medium Power Amplifier Fabricated Through a New Method of 3D-Copper Additive Manufacturing," IEEE 2015.

H. Kazemi, "Ultra-compact G-band 16way Power Splitter/Combiner Module Fabricated Through a New Method of 3D-Copper Additive Manufacturing," IEEE 2015.

N. Jastram, "Wideband Multibeam Millimeter Wave Arrays," IEEE 2014.

J. Reid, "PolyStrata Millimeter-wave Tunable Filters," GOMACTech-12, Mar. 22, 2012.

"Multiplexer/LNA Module using PolyStrata®," GOMACTech-15, Mar. 26, 2015.

European Examination Report of EP App. No. 07150463.3 dated Feb. 16, 2015.

Extended EP Search Report for EP Application No. 12811132.5 dated Feb. 5, 2016.

* cited by examiner

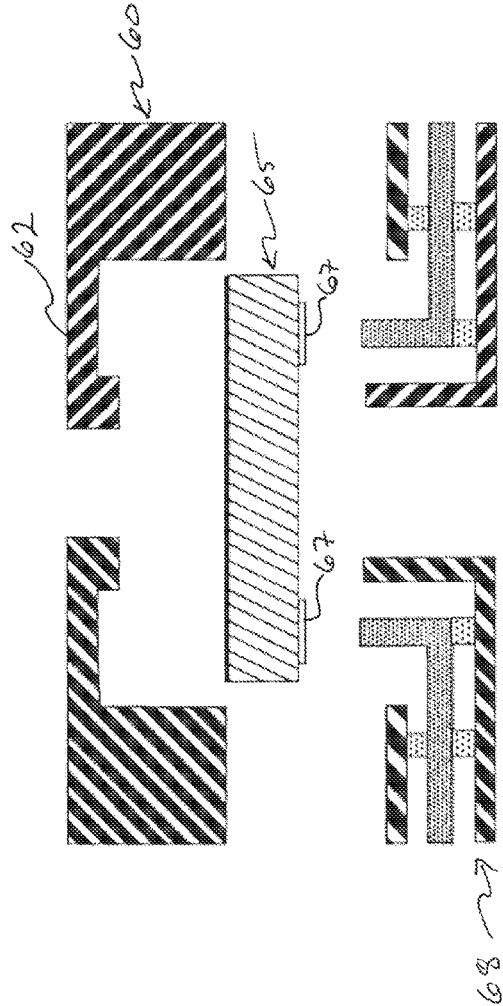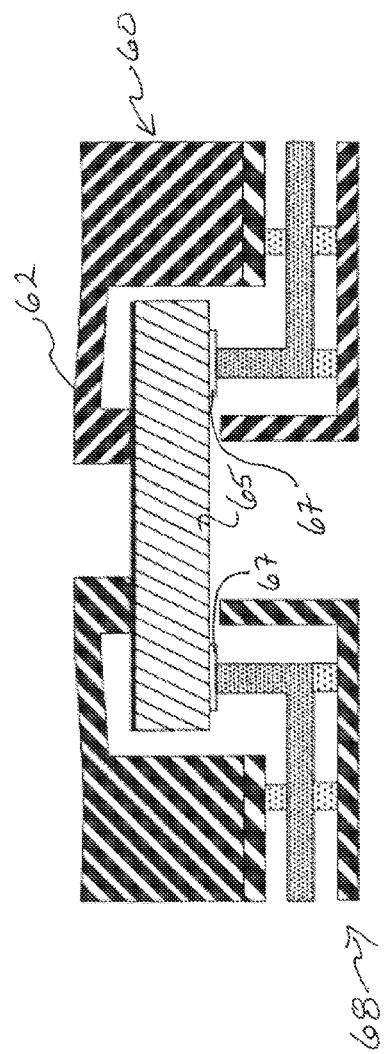
FIG. 7

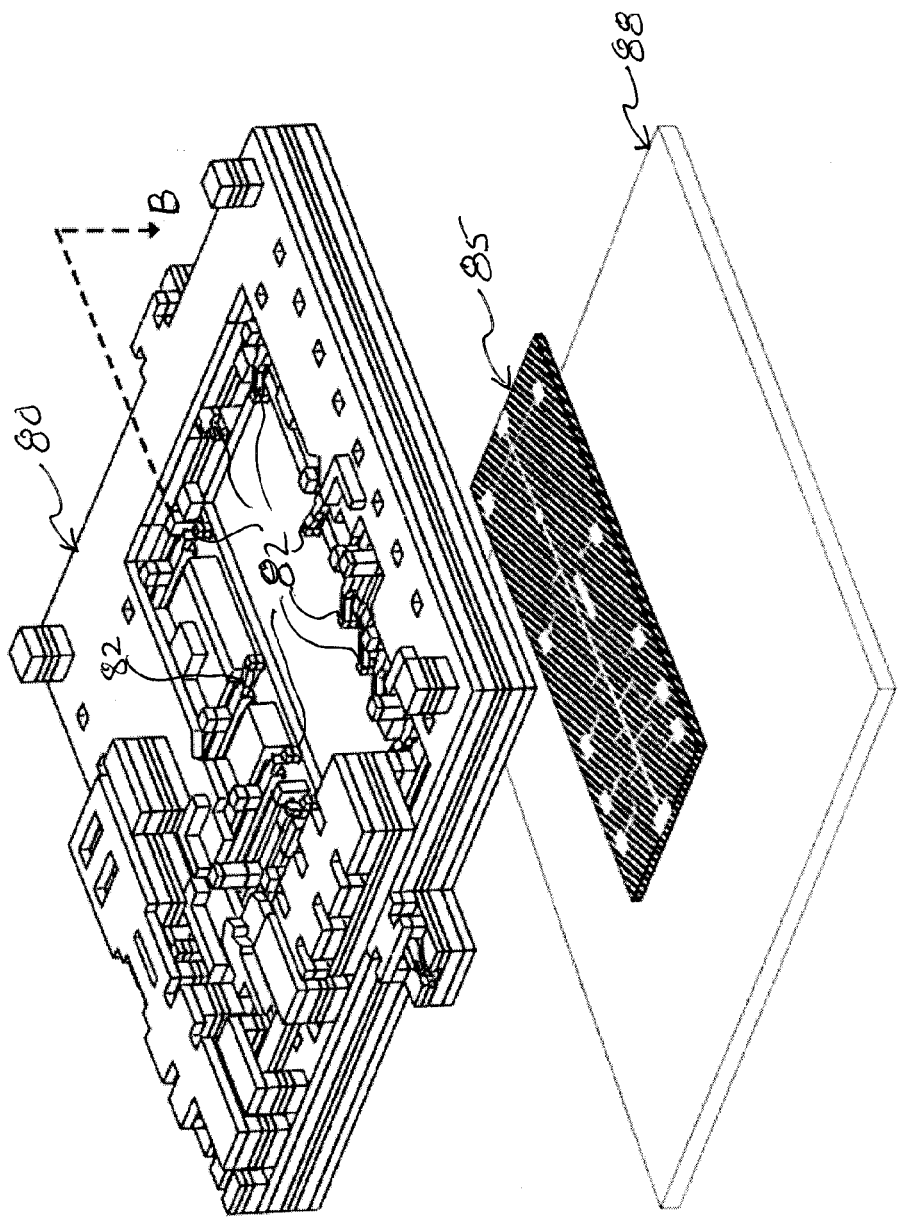

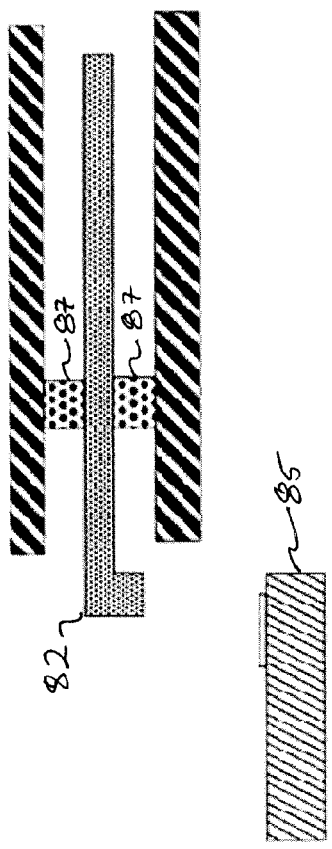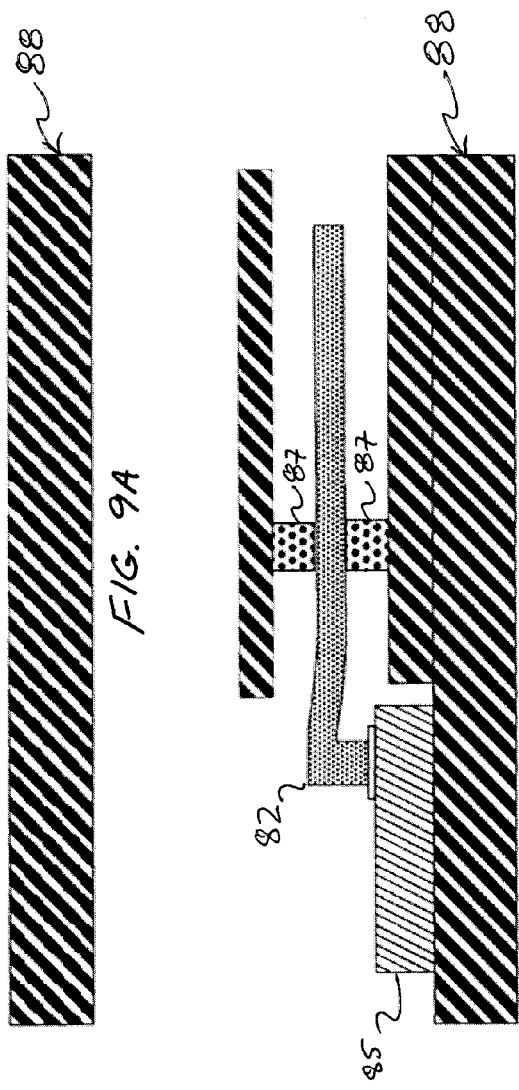

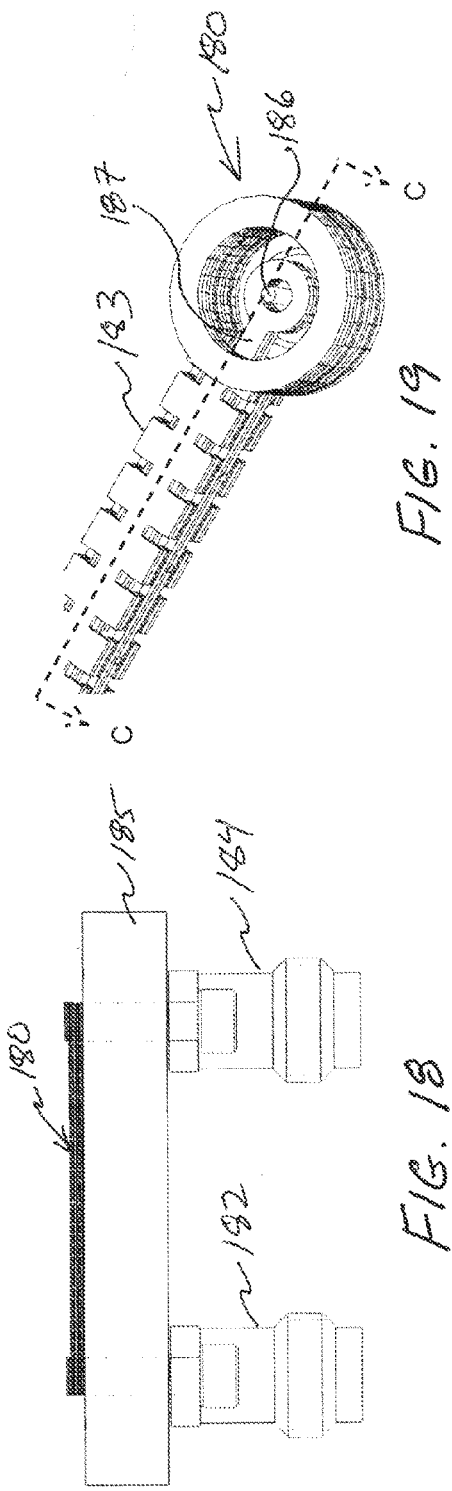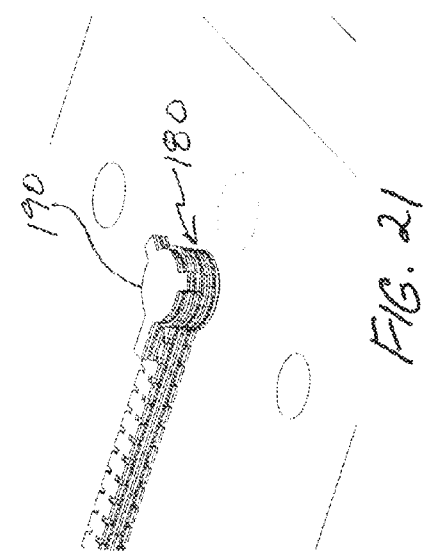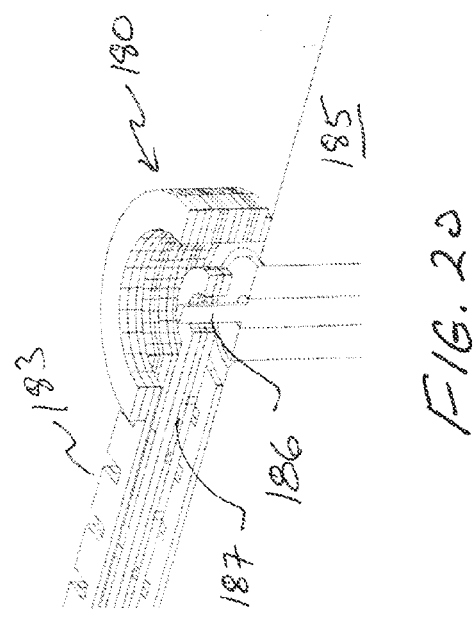

MICROSTRUCTURE INCLUDING MICROSTRUCTURAL WAVEGUIDE ELEMENTS AND/OR IC CHIPS THAT ARE MECHANICALLY INTERCONNECTED TO EACH OTHER

RELATED APPLICATIONS

This application claims the benefit of priority of U.S. Provisional Application No. 61/798,018, filed on Mar. 15, 2013, the entire contents of which application(s) are incorporated herein by reference.

GOVERNMENT LICENSE RIGHTS

This invention was made with government support under the contract numbers NNX10CA74C, NNX11AF27G and NNX11CB13C, each awarded by the National Aeronautics and Space Administration, and W31P4Q-12-C-0138 awarded by the U.S. Army, FA8650-11-C-1159 awarded by the U.S. Air Force, and SB-1341-12-SE-0598 awarded by the National Institute of Standards and Technology. The government has certain rights in the invention.

FIELD OF THE INVENTION

The present invention relates generally to structures and methods for interconnects and associated alignment, and more particularly, but not exclusively, to assembly mechanisms for and between chips, components, and 3D systems.

BACKGROUND OF THE INVENTION

There exists a need to create electronic and electromechanical systems often comprising dozens to many thousands of interconnects between subassemblies or modules. Several to many of said subassemblies may require to be joined to provide a solution for the final assembly that includes electrical, thermal, optical, mechanical and other forms of transduction and communication and also provide stability and support for the total assembly.

In building complex multilayer electronic and electro-mechanical systems, particularly those of high complexity, and high value, there remain challenges in building said systems with sufficiently high yield and or low re-work to produce said systems economically. This is particularly true when providing such systems in low quantity or with substantial customization or when providing reconfigurability and re-use of the key subsystems or modules comprising the integrated system.

For example, the desktop computer industry approached a similar but larger volume problem since at least the 1980s by creating motherboards and computer daughter cards with standardized connectors where the card and motherboard could be electrically and mechanically joined by one plugging into arrayed connectors and then being mechanically fastened to a metal chassis, for example, by screws. By doing so, cards could be replaced if defective, swapped to change functionality, and even motherboards replaced as necessary. Such boards and cards may be viewed as functional modules of a desired computer system that could be produced and tested independently of the final integrated computer system. Favorable benefits included not only improved yield and decreased rework, but also reduction in size of the system by allowing the system to become compact in a 3D volume due to the perpendicular interconnect.

This problem however is less straightforward for systems where one or more of the size, complexity, integration, weight, performance, or cost of desired interconnection becomes a limiting factor to produce the desired system. Even cooling such systems, for example in the aforementioned desktop computer, can remain a challenge, since forced air by using multiple fans become a difficult method to remove heat from all locations necessary. Also, thermal conduction through heat pipes and thermal busses and ground planes make modularity a challenge.

One can imagine maintaining the benefits of modularity would be desirable as one scales down in feature size or dimensions and scales up in complexity, functionality, and performance. Indeed this challenge has largely been addressed in modern consumer electronics by increasingly providing the functionality desired within microchips using integrated circuit technology where the size of the device's constituent elements, such as transistors, capacitors, resistors, interconnect metallization, and so on, have substantial improvements in reduced size and increased performance over discrete components. This trend of pushing so much desired functionality into densely integrated chips which are often permanently attached, combined with a rapid obsolescence rate has made it almost commonplace to dispose of the system if it fails; repair is too complicated and/or the cost of such repair exceeds the value of the system.

Compare this situation to one where the value of the components or chips or modules are very high but one or more of the integration density, size, weight, yield, performance and price are limiting factors, such that rework and modularity are required. Add to this the inability for any single semiconductor technology to provide all the performance or functions desired, or there simply being added constraints that make it impractical to integrate all the functions intimately into a chip or wafer level process. For example, a microwave phased array requires many functions, levels of interconnect, routing and distribution of signals and power, and require sophisticated engineering for heat dissipation, particularly as frequency increases and the dimensions available decrease. The area it needs to consume is based on performance limitations of its transmit/receive elements, but are also limited by the frequencies/wavelengths of its operation. For example at lower frequencies like X or S band, the pitch of the needed antenna elements are on a large spacing such that a wafer-level phased array does not appear to make sense even if the performance of the electronic components needed for each element were not the limiting factor. If one needed high power at S band, semiconductor technologies like GaN integrated circuits may be able to provide it, but it would not be economic to waste the un-needed area required by the antenna element spacing for a monolithic semiconductor technology any more than it would make sense to provide the many functions of a computer motherboard through complete integration onto a large semiconductor wafer.

Still there is the desire to combine many complex functions for systems such as phased arrays or mm-wave power amplifiers into the minimum size, volume, and weight possible. For many high end and often low volume applications, for example satellite applications, there is also the desire to not compromise performance.

Previous art has outlined interconnect technologies that can provide the routing and distribution of power and signals from DC to many hundreds of GHz. For example the PolyStrata® technology (a 3D additive build technology) developed and being commercialized by Nuvotronics LLC, Radford Va., USA is one such technology. Its ability to produce multi-layer, low dispersion, high isolation, coaxial and waveguide interconnection, combined with its high thermal conduction and ability to integrate thermal pathways, as well as its ability to interconnect with minimal excess parasitics to monolithic microwave integrated circuits, RF and DC passive components, and antenna elements makes it an ideal integration medium, similar to the use of circuit board technology that has integrated chips and other components for electronic applications.

Still the cost, yield, and complexity of the desired components to produce systems that push the edge of the state of the art in electronics may be such that modularity and rework are necessary economically and practically to produce such desired systems. However solving the challenges of modularity and rework when size and performance and even mechanical requirements of the necessary interconnect remains unsolved. Currently microelectronics approaches similar commercial problems using methods such as chip-stacking technology, through-substrate vias, tiered wirebonds, and in some cases attempts to integrate more than one semiconductor technology onto a single wafer. While these approaches may solve certain problems in volume production for reduced size, weight, and interconnection, they are not technologies that readily lend themselves to lower volumes, particularly where it is desired to have relatively un-compromised performance, rework, or modularity.

A further problem in existing electronic and electromechanical systems relates to chip or component interconnects. For instance, traditionally a semiconductor circuit or MEMS device is formed on wafer and then diced or otherwise separated into chips. For example, a MMIC power amplifier circuit made on a GaAs wafer. The chip would be formed with metal pads for probing and bonding to connect to the chip. Typically the back surface of the chip would be connected to a heatsink and electrical ground plane and then the front surface containing the bond pads would be wedgebonded or wirebonded into a surrounding circuit; alternatively the chip may be connected to a leadframe of a chip package, or packaged or used otherwise as is known in the art. In all of these cases, metal connections made by fused small wires such as gold wires, or by solders, are used to electrically join the chip's bond pads typically located around a perimeter of a chip, to the rest of the circuit, or are connected to leads for example of a lead-frame, to package the circuit. In the electronics industry today, high value chips can often be packaged in a manner that they can be inserted and removed from a separately formed chip-socket, said socket typically disposed on a motherboard. The chip socket provides the electrical and sometimes the thermal interfaces to and from the packaged chip. An example of this is the CPU on computer motherboards. Because the CPU is often the most expensive component and because it is desirable to be able to replace it to upgrade or service the computer system, the chip is packaged in a way to work in conjunction with a partner socket, allowing the packaged chip to be removed and replaced—thereby maintaining and improving the serviceability, versatility, and lifetime of the computer system. It remains a desirable and unmet need to reduce the size, mass, and form factor of a chip interconnection system—while improving performance. The performance aspect becomes of increasing interest on its own as frequency of operation of function on the chip increases from several to tens to hundreds of GHz where all aspects of chip become increasingly critical such as material properties, interconnect dimensions, transmission line properties, and any transitions to and from the chip. Thus a chip often must be designed for a specific method of packaging it. For example standards are created using leadframes, bondwires, overmolds and so on. For high frequency applications, for example, the surface mount "quad flat no-lead" or QFN has emerged as a popular approach as a variant of the quad flat packages (QFP). Despite the method of packaging, high value chips must typically be tested before being packaged. It would be desirable to have a system where the bare chip does not need to be additionally packaged in any permanent manner and instead the "bare die" can be inserted and interconnected into the system and still readily be removed to be replaced, without reworking or removing interconnect features from the bare die applied during packaging or assembly. For example, it would be desirable to eliminate the interconnects to a chip that are typically intended to be permanent, such as wirebonds, wedgebonds, beamleads, solder bumps or adhesive layers.

The PolyStrata® technology by Nuvotronics (disclosed in U.S. Pat. Nos. 7,012,489, 7,148,772, 7,405,638, 7,948,335, 7,649,432, 7,656,256, 8,031,037, 7,755,174, and 7,898,356, the contents of which patents are incorporated herein by reference), for example, has addressed the ability to integrate independently fabricated standard connectors including microwave connectors. It also has demonstrated stacked and lateral interconnect through conventional means such as solder joints. Independently fabricated and integrated connectors have the disadvantage of consuming substantial volume, size and even weight compared to the dimensions of chips and PolyStrata® integration substrates. In addition when many such interconnections are needed, substantial joining force and size mismatch become a limiting factor, for example in connecting dozens or hundreds of RF and DC interconnects. As frequency scales to mm-wave and beyond, loss and mismatch also become greater problems. For example, some of those have been described by Nuvotronics in international patent application publication number WO/2013/010108 "Methods of fabricating electronic and mechanical structures," the contents of which are incorporated herein by reference.

Alternatively direct PolyStrata® board to board stacking or lateral joining connections between the coaxial RF, DC, waveguide, or thermal pathways may be based on direct solder joints at transition regions typically of the edges or upper or lower surfaces. Those interconnections based on solder joints have the disadvantage of often requiring the reflow of the solder to ensure a stable DC and RF junction that for example can allow testing or use in the field. Such reflow on a small scale becomes a challenge as, in increasingly small areas, limiting the flow or wicking or capillary action of the solder—as well as maintaining a thermal solder reflow or bonding hierarchy that doesn't interfere with the attachment of nearby chips or other components or modules—becomes difficult to manage. Also solders in substantially small volumes become difficult to control compositionally due to mechanisms such as interdiffusion and consumption of noble metals and diffusion barriers that may be applied in the junction regions. Embrittlement of the joint are common issues from such problems. Exact height and position control also become a challenge when solder bumps or joints may be many 10's to 100's of microns in thickness even after reflow; meanwhile, an advantage present in a technology such as PolyStrata® technology is reproducibility and control of gaps and distances that may be on the order or several microns or less. A high degree of planarity may be crucial for making multiple micron-scale interconnections across large, multiple centimeter distances.

SUMMARY OF THE INVENTION

The present invention provides several innovations which can help enable systems, such as those described above, to be built with the desired modularity, while precision tolerances and high performance is maintained. For example, in a first inventive aspect the present invention may relate to formation mechanical structures in monolithically or sequentially formed planar subsystems that provide a spring force or clamping force within the microstructured metals and/or dielectrics by a deliberate design and tolerancing of elements disposed therein to create snap-together features that may elastically deform during the interconnection process and still maintain sufficient connection force after being joined. As used herein the terms "interconnected" or "interconnection" are defined to denote mechanically joined to create a system wherein the subsystems are in communication electrically, thermally, optically, and/or fluidically and are mechanically interlocked permanently or temporarily to form a desired system.

In a second inventive aspect, the present invention may provide innovations related to the first inventive concept in a somewhat different way to create "dry" planar subsystem to chip or component interconnects so that the chip does not need to be additionally packaged, and the "bare die" can be inserted and interconnected into the system and still removed to be replaced without rework that requires steps such as cutting wirebonds or desoldering bumps and/or removing difficult to service adhesive layers intended to be permanent.

In a third inventive aspect, the present invention may provide a solution to both alignment and clamping is the direct formation of precision holes within or at the edges of the 2.5D layers in layer by layer build process such as PolyStrata® process or even solid printing applications. (2.5D structures or devices are those which may have nearly any pattern within the plane of formation of a layer but the layer has a predefined thickness.) In a fourth inventive aspect, the present invention may provide the ability to create threaded holes using only a 2.5D build process. In a fifth inventive aspect, the present invention may provide a hole-shaped interconnection that permits connection from a coaxial transmission line to any industry standard pin connector.

In a sixth inventive aspect, the present invention may provide a method for utilizing precision fabrication techniques to create solder joints with controlled height, which is useful both for filters (setting capacitance), setting the precise height of cavities, and for ensuring good lifetime of a solder joint.

BRIEF DESCRIPTION OF THE DRAWINGS

The foregoing summary and the following detailed description of exemplary embodiments of the present invention may be further understood when read in conjunction with the appended drawings, in which:

FIG. 7 schematically illustrate cross-sectional views taken along the section line A-A of FIG. 6 of an exploded (upper) and assembled (lower) cross-section views of an exemplary conceptual signal interconnect which places a chip in face-down position, and applies pressure to the back of the chip using a mechanically design cantilever to hold the chip in position;

FIGS. 8A, 8B schematically illustrate isometric exploded and assembled views, respectively, of an exemplary conceptual MMIC socket using cantilever beams to conduct RF and DC signals in accordance with the present invention;

FIGS. 9A, 9B schematically illustrate cross-sectional views of the exemplary conceptual signal interconnect of FIGS. 8A, 8B, respectively taken along the sectioning line B using the cantilever mechanical locking feature in accordance with the present invention as conductor;

FIG. 18 schematically illustrates a side elevation view of an exemplary connection between a coaxial connector, such as a 1.85 mm, 2.4 mm, 2.92 mm, 3.5 mm, or SSMA style connectors, and PolyStrata® coaxial-line in accordance with the present invention;

FIG. 19 schematically illustrates an isometric view of an exemplary connection between a coaxial connector inner pin and PolyStrata® center conductor line in accordance with the present invention;

FIG. 20 schematically illustrates an isometric cross-sectional view of the exemplary connection of FIG. 19 taken along the section line C-C;

FIG. 21 schematically illustrates an isometric view of the exemplary connector inner pin and PolyStrata® center conductor line of FIG. 19 with an exemplary top PolyStrata® enclosure to reduce radiation/loss of the transition structure;

DETAILED DESCRIPTION OF THE INVENTION

Figure 1:
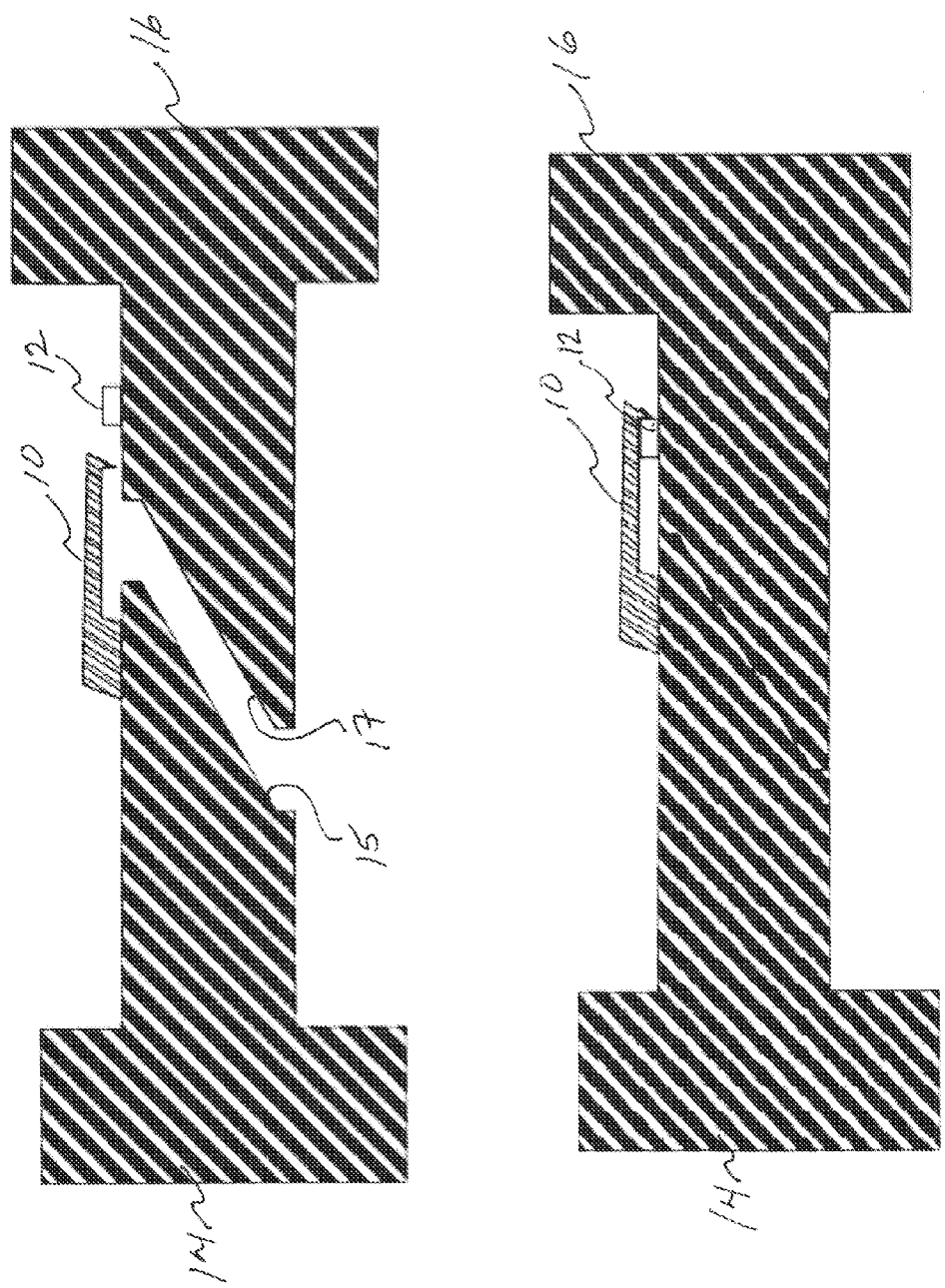
FIG. 1 schematically illustrates cross-sectional views of an exemplary mechanical latching clip in accordance with the present invention for joining two subsystems in the same plane as their formation, shown in both unjoined (upper) and joined, latched (lower) states.

Referring now to the figures, wherein like elements are numbered alike throughout, the present invention provides several innovations which can help enable systems, such as those described above, to be built with the desired modularity, while precision tolerances and high performance is maintained. For example, in a first inventive aspect the present invention may relate to formation of mechanical structures in monolithically or sequentially formed planar subsystems that provide a spring force or clamping force within microstructured metals and/or dielectrics by a deliberate design and tolerancing of elements disposed therein to create snap-together features that may elastically deform during the interconnection process and still maintain sufficient connection force after being joined. For example first and second subsystems 14, 16 may be operably joined to one another via the action of a latching clip or spring 10 disposed on the first subsystem 14 which latches to a corresponding detent 12 on the second subsystems 16, FIG. 1. The mating junctions between the latching clip 10 and detent 12 may be designed to ensure there is suitable force between the mating or joined surfaces 15, 17 to show a negligible contact resistance between the typically metal to metal interface surfaces 15, 17, even under the added stress of mechanical or thermal changes, shocks, or vibrations that the junction may see during its intended use. The mating interconnections, such as latching clip 10 and detent 12, may be disposed between subsystems 14, 16 in the same plane as the plane of formation of the planar subsystems 14, 16 or may be to planar subsystems being joined orthogonally to the plane of their formation, or the mating interconnections may be joined at any angle in any plane in any desired configuration that can be designed and meet the intended purpose and function.

Figure 2:
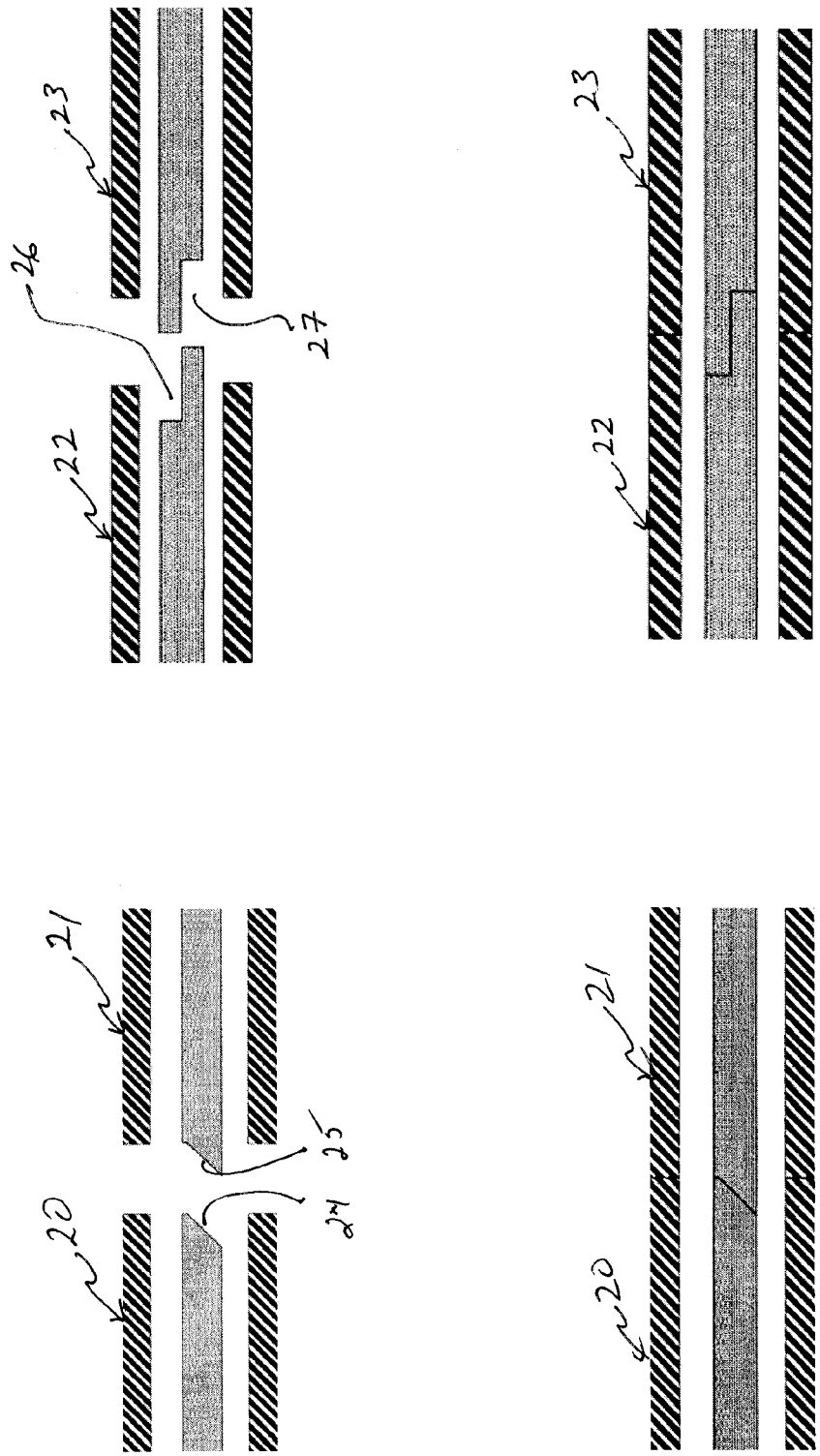
FIGS. 2A, 2B schematically illustrate cross-sectional views of two exemplary styles of mechanical attachment interface for signal lines in accordance with the present invention, respectively, with each shown in both unjoined (upper) and joined (lower) states.

For example, for a lateral interconnection, physical interconnections between the substrate-free planar subsystems may take any number of forms as outlined in the figures. For example, planar coaxial waveguides 20, 21, in FIG. 2A and planar coaxial waveguides 22, 23 may include center conductors having complementary angled end faces 24, 25 shown in FIG. 2A, or complementary stepped end faces 26, 27, shown in FIG. 2B. Interfaces may consist of direct butt connections, lap joints, sliding joints, or other mechanisms. Interconnections may be fabricated protruding from a majority of the planar subsystems upper or lower surfaces, or regions of their end surfaces, to increase signal conductor interference and improve physical contact. This interference increasing feature can be readily seen with exemplary coaxial configurations in FIGS. 2A, 2B. Additionally, post-processed bumps or additional material may be also be added to increase the conductor interference after fabrication of the structure is complete.

Figure 3:
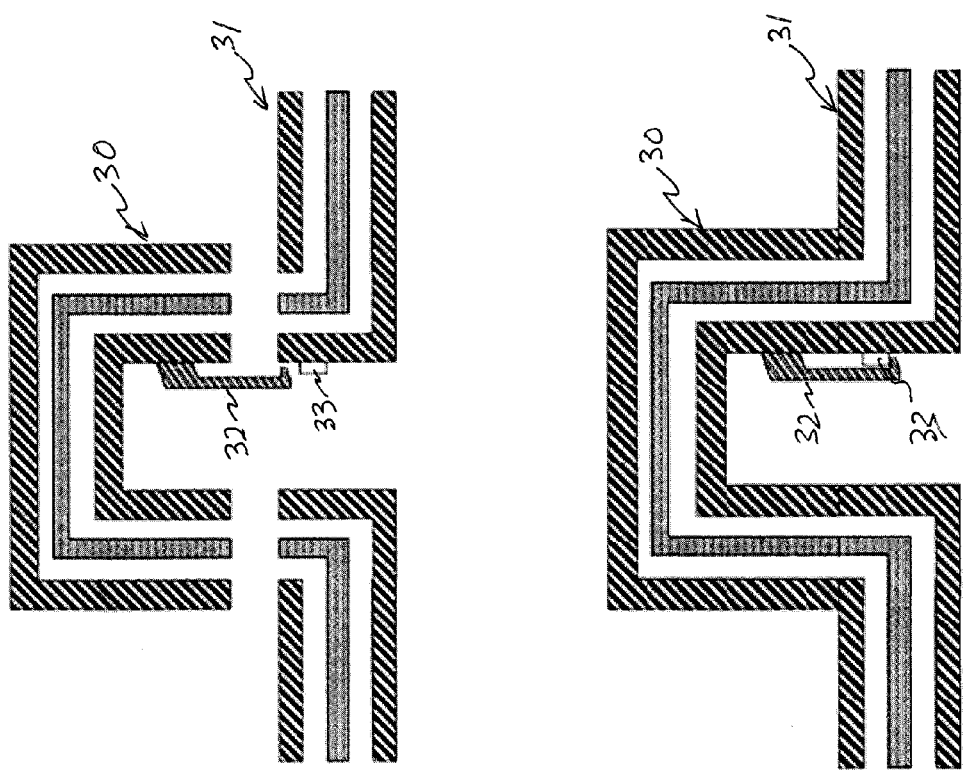
FIG. 3 schematically illustrates cross-sectional views of an exemplary orthogonally mated structures transmission line structures secured with a mechanical clip in accordance with the present invention, shown in both unjoined (upper) and joined, latched (lower) states.

Mating structures perpendicular to their plane of fabrication presents a different challenge, but the reward is drastically increased packing density, by more substantially utilizing the Z-dimension of the sub-system. For example, first and second subsystems 30, 31 incorporating coaxial waveguides may include a latching clip 32 and detent 33, respectively, similar to the latching clip 10 and detent 12 shown FIG. 1, and may be used to operably join first and second subsystems 30, 31 to effect electrical communication between the respective waveguides of the first and second subsystems 30, 31, FIG. 3.

Typical versions of structures made with the PolyStrata® or similar processes are sometimes called "2.5D" devices. This is because 2.5D structures or devices can have nearly any pattern in the plane of formation of that layer but the layer has a predefined thickness. That layer can be called a strata and it can contain one or more materials and when using a sacrificial mold or scaffolding material, regions of what will become empty space. Layer after layer are formed over each other creating many fused layers of one or more materials. In the exemplary PolyStrata® process that layer may be a metal and a dielectric. At the end of the formation of the laminate of many layers, the sacrificial material may be removed leaving the intended materials behind. A limitation of a 2.5D construction is that while it can have a nearly arbitrary definition in the plane of a particular strata or planar layer, there remains the difficulty that such clamping or snapping tongue-in-groove like structures are not readily fabricated out of the plane of fabrication. So for example, if an out of the plane of fabrication (that is, out of the plane of the layer(s), e.g., the X-Y plane or dimension) is taken as the vertical plane (that is, vertical being perpendicular to the plane of the layer(s), e.g., the Z-dimension or Z-direction), it is difficult to form a long vertical cantilever due to the excessive number of aligned layers required to make the structure. A somewhat related concept with advantages and challenges can be visualized for building structures out of LEGO® bricks.

Figure 4:
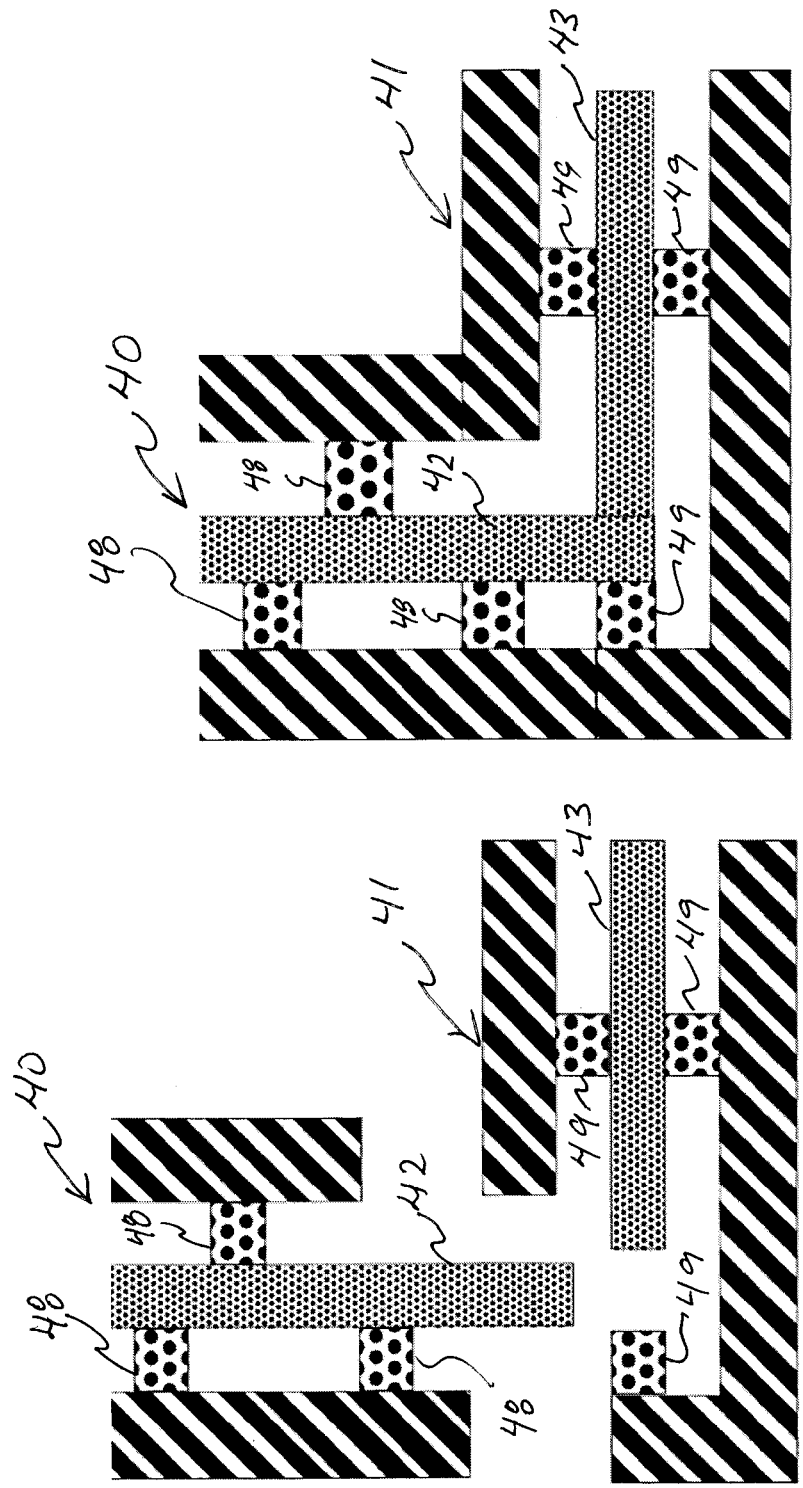
FIG. 4 schematically illustrates cross-sectional views of an exemplary alternative mating structure for orthogonal connections between subsystems in accordance with the present invention, shown in both unjoined (left) and joined (right) states.

Returning to FIG. 3, for systems fabricated using a 2.5D process, the mating structures, such as latching clip 32 and detent 33, for one of the two subsystems 30, 31 may be limited by available Z-dimensional stackup, meaning the limitations of the total available build height or number of layers that can be joined monolithically in a single sequential build. This limits the interface structures to rectangular features in a Z-direction. For this reason, the mechanical clips used for these parts will most often be fabricated on the orthogonal pieces, such as first subsystem 40 as shown in FIG. 4. Mechanical latches or clips 32 and detents 33 may be made in the same process to allow temporary or permanent retention of the interconnected subsystems 30, 31. Typically, this results in a butt connection, but more complex sliding interfaces may be employed to take advantage of the relative rigidity of the center conductors in a longitudinal direction, FIG. 4. Specifically, first and second subsystems 40, 41 including coaxial waveguides with respective center conductors 42, 43 may include respective dielectric posts 48, 49 as both a guide and a means to keep the center conductor 42 of the first subsystem 40 in contact with the center conductor 43 of the second subsystem 41. For the center conductor 42 of the first subsystem 40, it is possible to take advantage of the superior definition of the 2.5D process in the X-Y dimensions to create complex and intricate structures.

Figure 5:
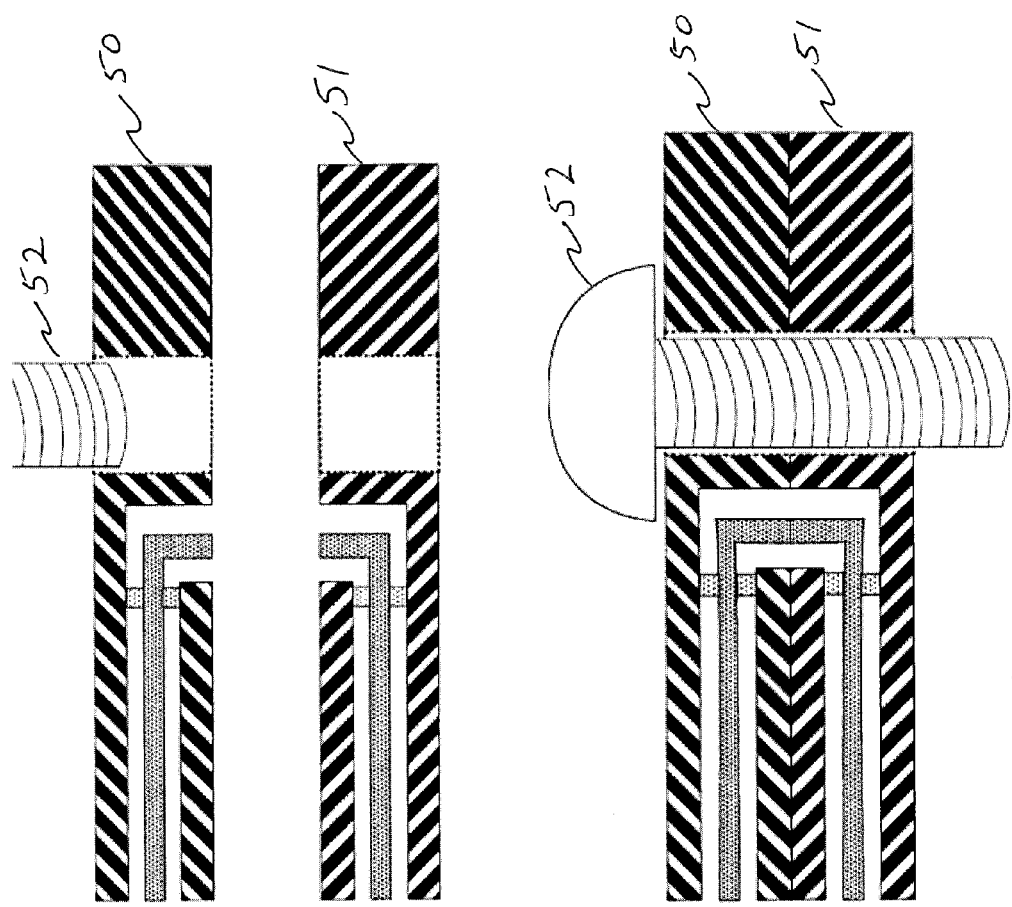
FIG. 5 schematically illustrates cross-sectional views of exemplary planar stacked subsystems secured with screws in accordance with the present invention shown in both unjoined (upper) and joined (lower) states.

Similarly, subsystems 50, 51 may be held in place by the use of tiny screws 52 of the type used in watch-making, PIM fasteners, cotter pins, dowels with locking mechanisms, or any of a number of other mechanical fastening systems, FIG. 5. While arrayed connectors such as motherboard and daughter card connectors exits, in this case there are no separately formed connectors that are joined to a circuit board substrate. Instead, the interconnections are designed into terminal ends of the DC and RF transmission lines that form the substrate free planar subsystems.

For example, FIG. 5 schematically illustrates a close-up cross-sectional view of a region of primarily air-dielectric coaxial transmission lines in each of two planar subsystems or modules, 50 and 51 that are being assembled by compression using screw 52. A cross-sectional view of the coaxial transmission line can be seen for each part. Most of the center conductor is shown parallel to the plane of fabrication, and turning out of plane to opposing surfaces near the entry point for the screw. The center conductors are supported using dielectric supports located above and below the center conductor in proximity to where the center conductors turn out of plane. Each terminate near, and slightly beyond, the a surface of their respective ground planes. Thus, center conductors in the top view of FIG. 5 can be made to protrude slightly beyond past the surrounding ground plane for each opposing part. By doing so when the two halves are aligned, assembled, and compressed together, the opposing terminal ends of the center conductors will slightly deflect with a cantilever motion constrained by the dielectric blocks as well as the need to achieve planarity between the two parts ground planes when under compression. This pressure may be achieved in this case by inserting and tightening screw 52 into a lower region not shown. This compressive force can be engineered through several factors, including the choice of materials for the metal and dielectric, the dimensions and positions of the center conductors and dielectric blocks, the length of center conductor located past the final dielectric block, and the degree of protrusion of the terminal ends of the center conductors above their surrounding ground planes as found in their non-compressed state. The level of force can therefore be engineered to ensure a low resistance continuous DC connection is achieved between these conductors that will be maintained even under typical conditions of mechanical shock and vibration as well as thermal shock and thermal cycles. A noble surface finish for the conductors such a gold may be chosen for the surfaces in the region of contact to ensure low contact resistance is maintained before the parts are assembled. Through techniques such as these, several or even hundreds of DC and RF connections can be made between free-standing planar subsystem boards such as those build using the PolyStrata process. Such connections may be typical in building complex systems such as phased arrays where layers may include feeds to hundreds of antenna elements, distribution networks, and layers of active devices. A benefit of this type of assembly over solder reflow attachment if the ability to test the system and replace layers if needed. While such connections may be used independent of a semi-permanent attach such as solder, they may also be used to the system before additional surface layers of solder are reflowed to make the connections semi-permanent.

In concert with these mating structures, tightly toleranced alignment features may be critical to the high-accuracy placement necessary to make high-quality interconnections for less than 10 to several to 1 micron accuracy. In particular, mating cycles where it is desired to make large numbers of interconnections in a single cycle require, in addition to high degrees of planarity and uniformity, highly accurate placement in all three dimensions. Alignment features may take the form of interlocking structures, lap joints, sliding structures, or visual alignment marks. Ideally, such alignment marks may incorporate features which facilitate self-alignment and/or coarse alignment, allowing the key aspects of the assembly of the substrate-free planar subsystems, as wells the joining of said subsystems together into systems, by hand and/or without the requirement of high-precision placement machines. Eliminating the requirement where possible for these machines is desirable since micron accuracy chip placement tools, or automation stations with micron accuracy robotic motion, can cost on the order of hundreds of thousands to millions of US dollars. These self-aligning features might include tapered pin-and-hole structures, nested visual crosshairs, or diagonal features on interlocking fins, which will be described in more detail below in connection with inventive concept three.

Figure 6:
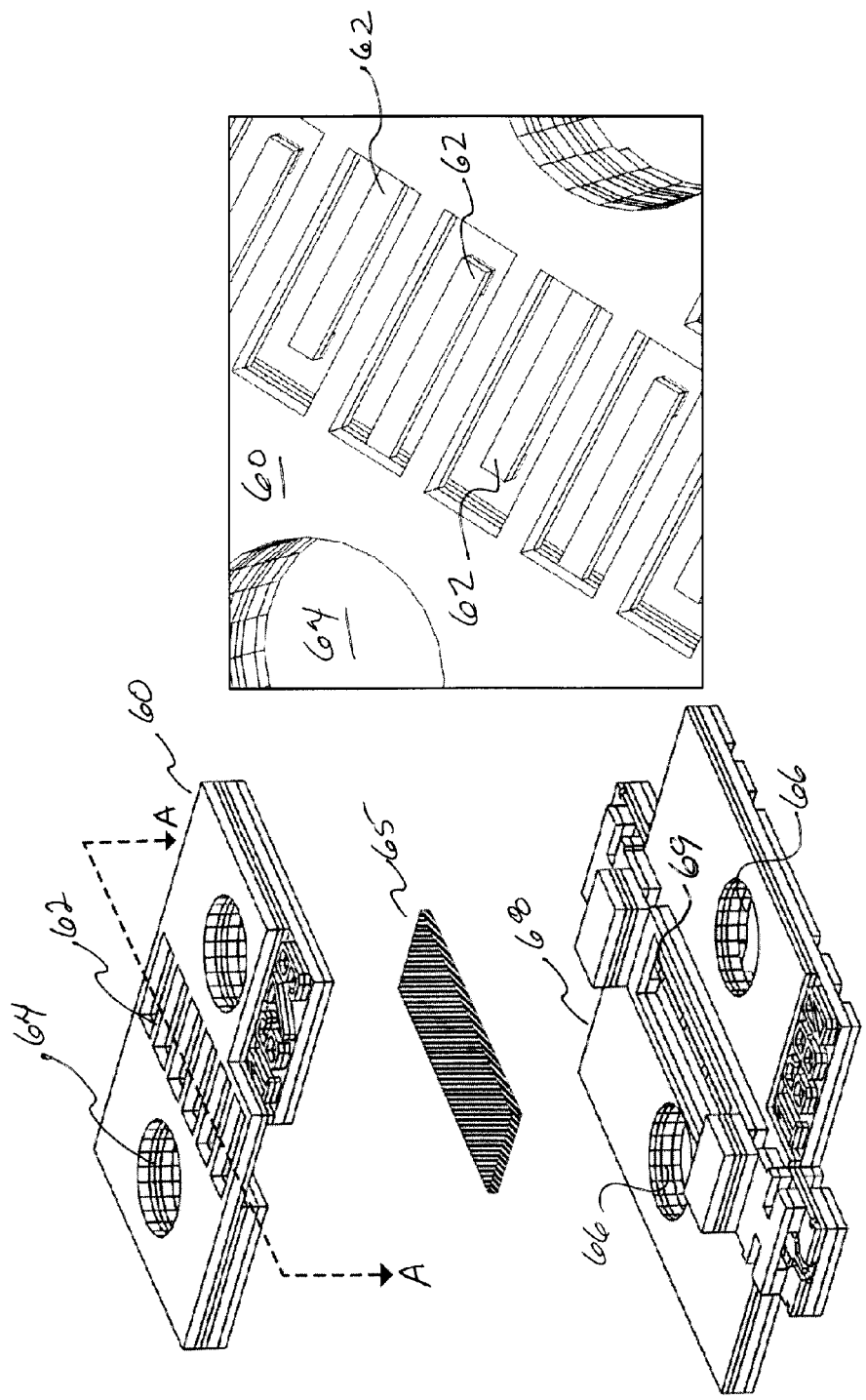
FIG. 6 schematically illustrates an isometric view of an exemplary chip socket employing cantilever structures in the lid in accordance with the present invention to provide mechanical interface.

In a second inventive aspect, the present invention may provide innovations related to the first inventive concept in a somewhat different way to create "dry" planar subsystem to chip or component interconnects, so that the chip does not need to be additionally packaged, and the "bare die" can be inserted and interconnected into the system and still removed to be replaced without rework that requires steps such as cutting wirebonds or desoldering bumps and/or removing difficult to service adhesive layers intended to be permanent, FIG. 6. To achieve this elusive solution, a lower planar subsystem 68 of the present invention may employ a bare die socket 69. In such a bare die socket 69 the electrical or electrical and thermal interconnect may be achieved by cantilever probe 62 or spring forces between DC and RF transmission lines of upper and lower planar subsystems 60, 68 and a chip 65. The spring forces may be applied for example by using a clam-shell design for the sub-systems 60, 68 such that the chip 65 with bond pads 67, FIG. 7, is mounted face down into a socket 69, FIG. 6. The spring forces are illustrated in the flexed cantilever probes 62 illustrated in the lower panel of FIG. 7. The socket 69 may include spring-loaded electrical interconnects, and the chip 65 may have a thermal back surface applied. The upper and lower planar subsystems 60, 68 may be screwed down with screws provided in holes 64, 66, as shown in FIG. 6, until the thermal back surface is in compression into the chip socket 69 provided by the upper and lower planar subsystems 60, 68 to compress the chip 65 into thermal and electrical communication, FIGS. 6, 7.

A similar arrangement can be done with the chip 85 face up and the electrical interconnect being transferred and applied by a specially constructed lid element 80 to complete the test socket via the very same cantilever beams 82 which provide the force to hold the chip 85 in place against a handling plate

Figure 8B:
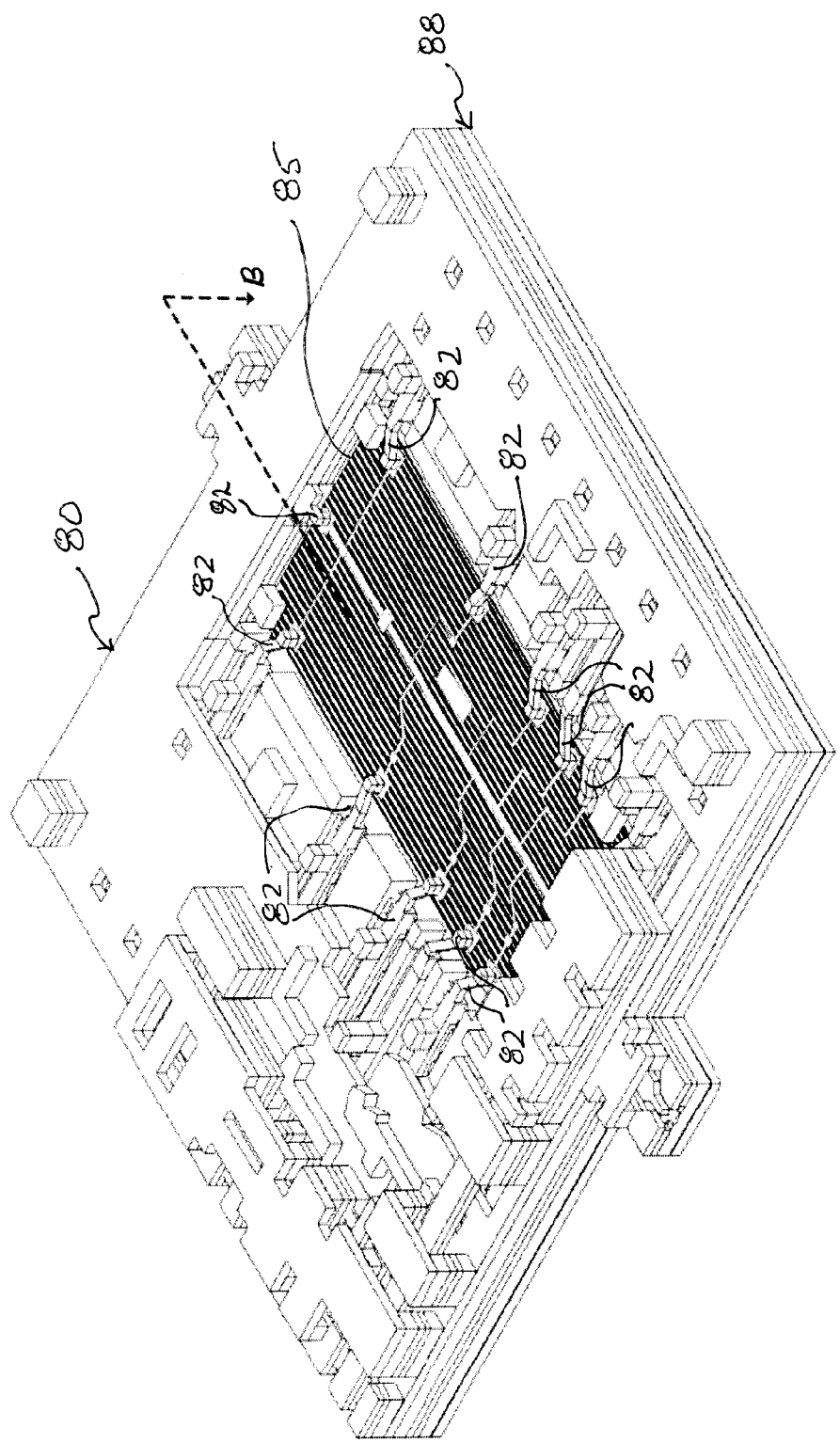
Figure 10:
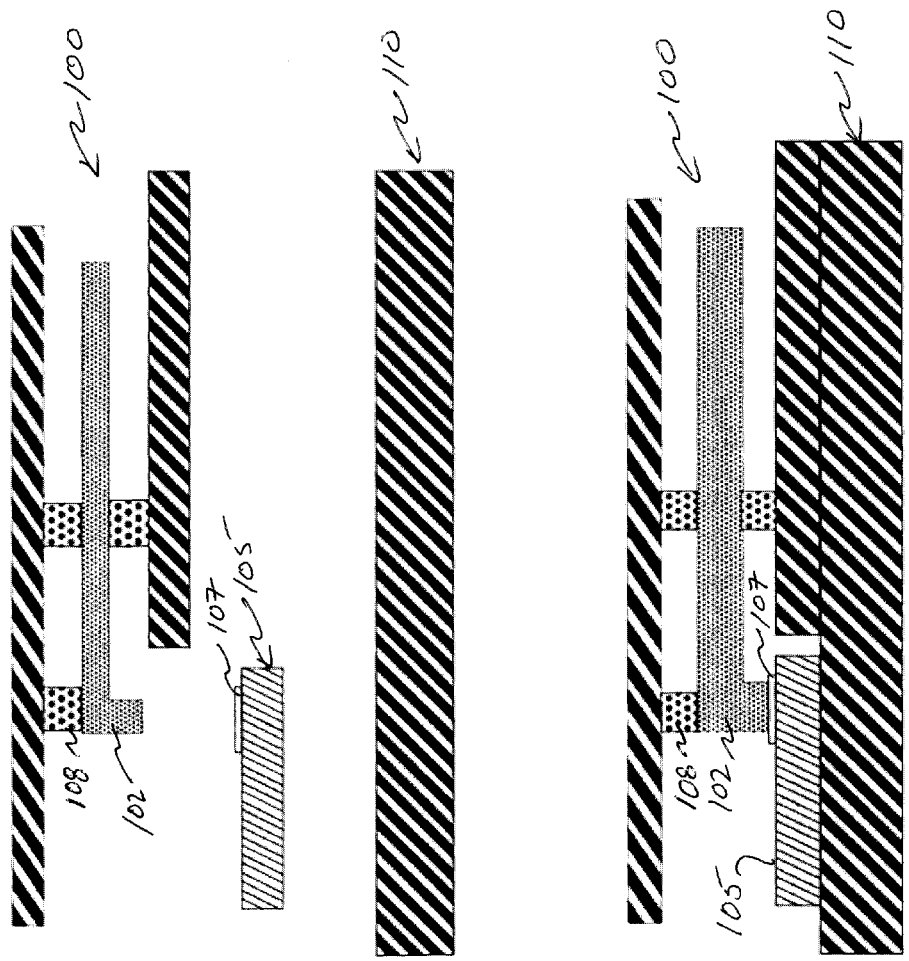
FIG. 10 schematically illustrates cross-sectional views of an exemplary conceptual signal interconnect with dielectric support holding the interconnection in compression in accordance with the present invention, shown in both unjoined (upper) and joined, latched (lower) states.

88, FIG. 8A. Often, high-value MMICs will be permanently attached to plates of CuMo, CuW, or brass via epoxy or solder to improve thermal performance, improve CTE match to the tooling, or to alleviate general handling concerns. The handling plate 88 can be secured using in-process mechanical features, or additional fastening structures such as screws or clips. The cantilever beams 82 can be used to connect DC power and signals as well as RF signals and ground planes, FIGS. 8A, 8B, 9A, 9B. The cantilever beams 82 may have post-processed material applied to their tips to increase the deflection and improve contact and may include dielectric posts 87, as shown in FIGS. 9A, 9B, in a similar manner to the dielectric posts 48, 49 of FIG. 4. For RF transitions, one may optionally coat the interconnecting cantilever beams 82 with a dielectric to achieve a capacitive connection. A third implementation of this concept may include a compressible pad 108 made of dielectric or other material disposed within the lid 100, which dampens the cantilever motion effect of the signal probe cantilever 102. This allows for less range of motion, and increases the pressure on the chip bond pads 107 of the chip 105 as the lid 100 and base 110 are joined, thereby reducing potential interface issues, FIG. 10.

By any such means the bare chip 85 may be replaced simply by removing the screws or other fastening elements, and removing any thermal grease or other transfer medium such as a phase change medium. Since no wirebonds, wedgebonds, or desoldering steps are needed, the bare chip 85 may be readily replaced, and, because there is no intermediate packaging of the chip, the parasitics of packaging the chip 85 may be minimized. This is particularly true when using PolyStrata® technology, since coax to CPW probe transitions may be employed—directly interfacing the planar subsystem transmission lines to the chip 85 without needing a separate chip package. As testing of the planar subsystem of lid 80 and handling plate 88 may be desired in advance of inserting the desired chips 85, dummy through-line structures may be inserted instead and removed in the same way. Butt-coupled junctions both in and out of plane may also be designed to have some degree of spring force, such as one may find in a cantilevered probe 82; however, to have a suitable sustaining force between formed subsystems, the layers require both precision alignment and mechanical clamping. Such structures and approach of the present invention of using a compression and spring force based electrical interconnect for bare chip 85 can greatly increase the speed of assembly while reducing un-necessary bulk, size, and cost and while improving performance. Alternatively, this arrangement may be desirable as a means to qualify chips which require complex environmental conditions or complicated passive networks to perform their desired functions. For example, a MMIC which requires placement in a custom cavity, with a complex bias network.

Figure 11:
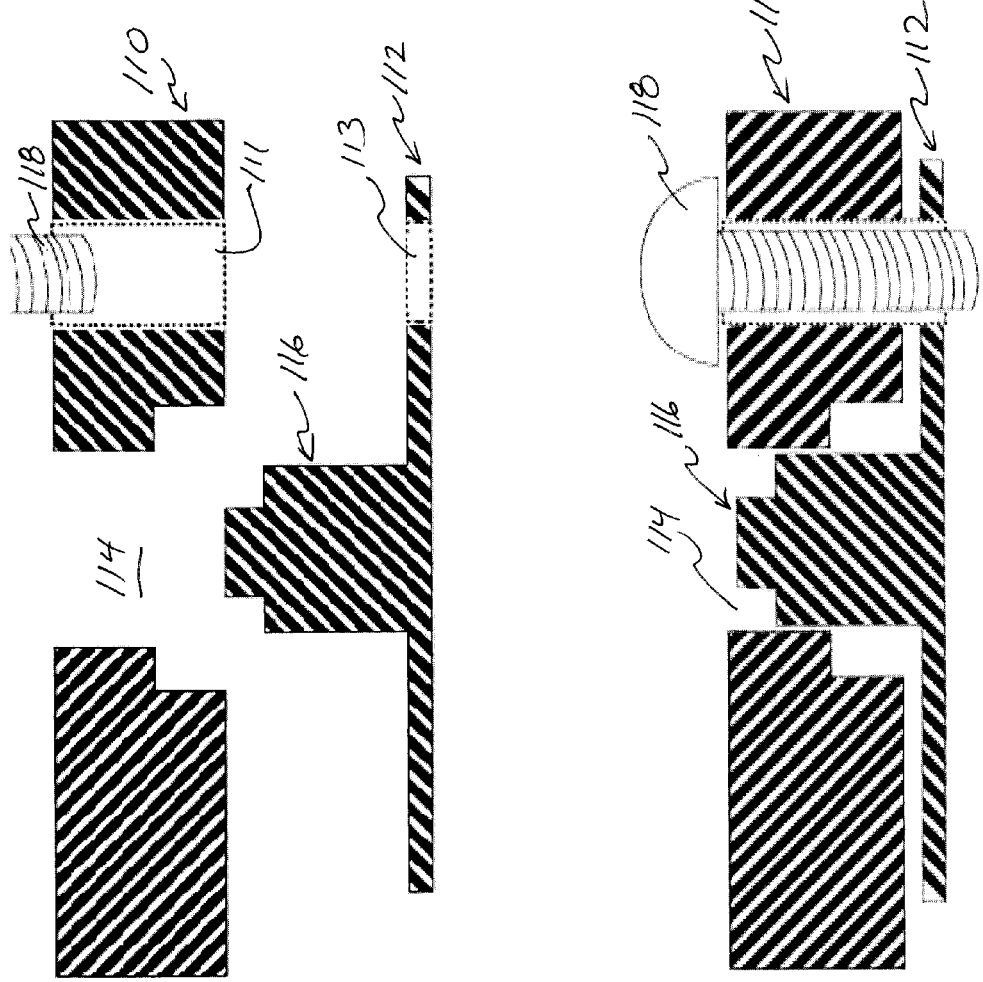
FIG. 11 schematically illustrates cross-sectional views of exemplary highly toleranced alignment features, with tapered pins and holes allow for gross alignment by hand, shown in both unjoined (upper) and joined, latched (lower) states.

In a third inventive aspect, the present invention may provide a solution to both alignment and clamping is the direct formation of precision tapered holes 114 within or at the edges of the 2.5D layers in layer by layer build process such as PolyStrata® process or even solid printing applications, FIG. 11. In this regard, in one exemplary configuration, first and second modules 110, 112 may include a mating tapered hole 114 and tapered alignment pin or dowel 116. The tapered holes 114 within or at the edges of the 2.5D layers of the first module 110 can be used to align independent modules 110, 112 of PolyStrata® assemblies by receiving tightly toleranced tapered pins or dowels 116 which force the alignment of layers and through which a layer to layer alignment ranging from microns to submicron can be accomplished depending on the relative dimensions and tolerances of the tapered pins or dowels 116 and the formed PolyStrata® process tapered holes 114. Furthermore, a semi-permanent downward force can be applied using small screws 118 placed through corresponding screw holes 111, 113 of the first and second modules 110, 112, respectively. Screws 118 such as those employed historically in the precision mechanical wristwatch industry may be used. The PolyStrata® modules 110, 112 may be formed and interconnected in both in-plane and perpendicular to the plane of their original formation. A great advantage of this approach for these meso-scale assemblies is that suitable forces may be created in the layer to layer coaxial or DC junctions, particularly between gold coated surfaces, such that a solder interface—for example one produced by the reflow of solder bumps—may not be needed. Instead, proper mechanical means may be designed into the PolyStrata® substrates or module fabrics to distribute the downward forces in the ground planes and suspended transmission lines using appropriate cantilever design.

Separate substrate-free sub-systems, which may comprise chips and other devices hybridly or monolithically, may also be formed in a plane using a modular build. It is desirable that these sub-systems contain testable circuits and that sub-systems, also called modules, can be precisely aligned and interconnected. Preferably such precision alignment and interconnection may be performed by hand assembly without needing expensive tools and machines to align, move, register, and bond the sub-systems or modules. As frequency increases and dimensions go down, for example in modules that may contain signals or power at 40 or 100 GHz, precision registration and alignment of the transmission lines may be required that allow one module to be in electrical communication with another. These needs can be met when constructing larger planar substrate-free subsystems from smaller ones by monolithically incorporating mating features for mechanical interlocking.

Figure 15:
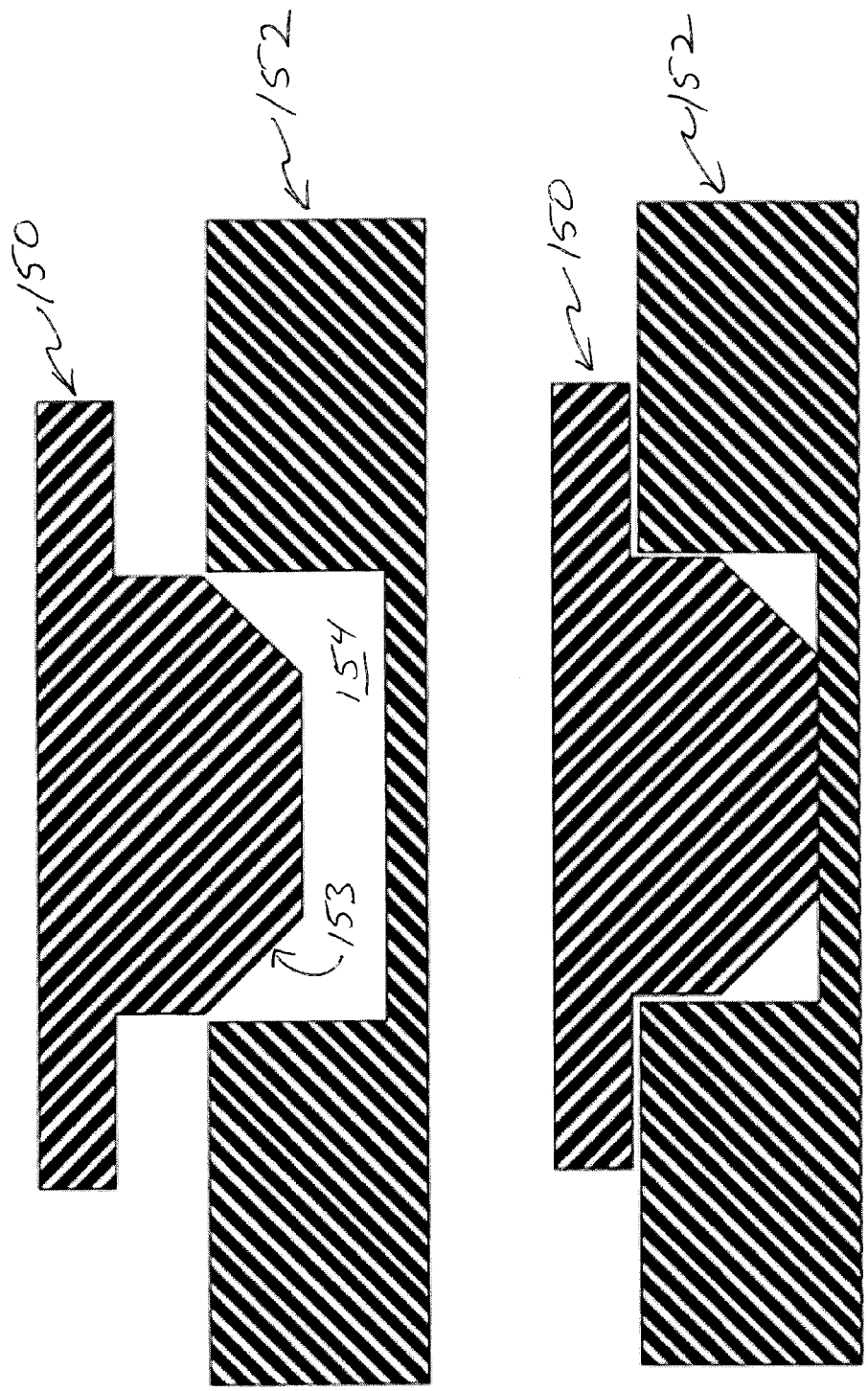
FIG. 15 schematically illustrates a cross-sectional view of exemplary tapered fins for gross alignment of two orthogonally mated substrate-free subsystems in accordance with the present invention, shown in both unjoined (upper) and joined, latched (lower) states.

For an orthogonal interconnection, additional approaches are available, given the dimensional accuracy in the orthogonal part. For example, a first subsystem 150 may be provided with the tapered structure, such as a tapered fin 153, which is configured to self-guide into a hole 154 provided in a second subsystem 152, to effect alignment between the first and second subsystems 150, 152, FIG. 15. The tapered edges of the fins 153 allow for self-alignment, guiding the parts into their tightly tolerance final, attached state. The tapered fin 153 and hole 154 may facilitate gross alignment. Alignment features may be provided in the form of tapered fins 153, as shown in FIG. 15, or any other of a number of shapes. For planar or lateral mating, including stacking, alignment features may take advantage of the high dimensional tolerances available in X-Y dimensions relative to those available in Z dimensions. A gross alignment structure would allow for the parts to be mated without the use of sub-micron accurate placement tools. The coarse alignment could be provided take by the tapered pins 116 and tapered hole 114, FIG. 11, slanted diagonal mating surfaces, FIG. 15, dielectric gaskets, or a number of other structures. Alignment features designed to be universal may also be key.

Figure 12:
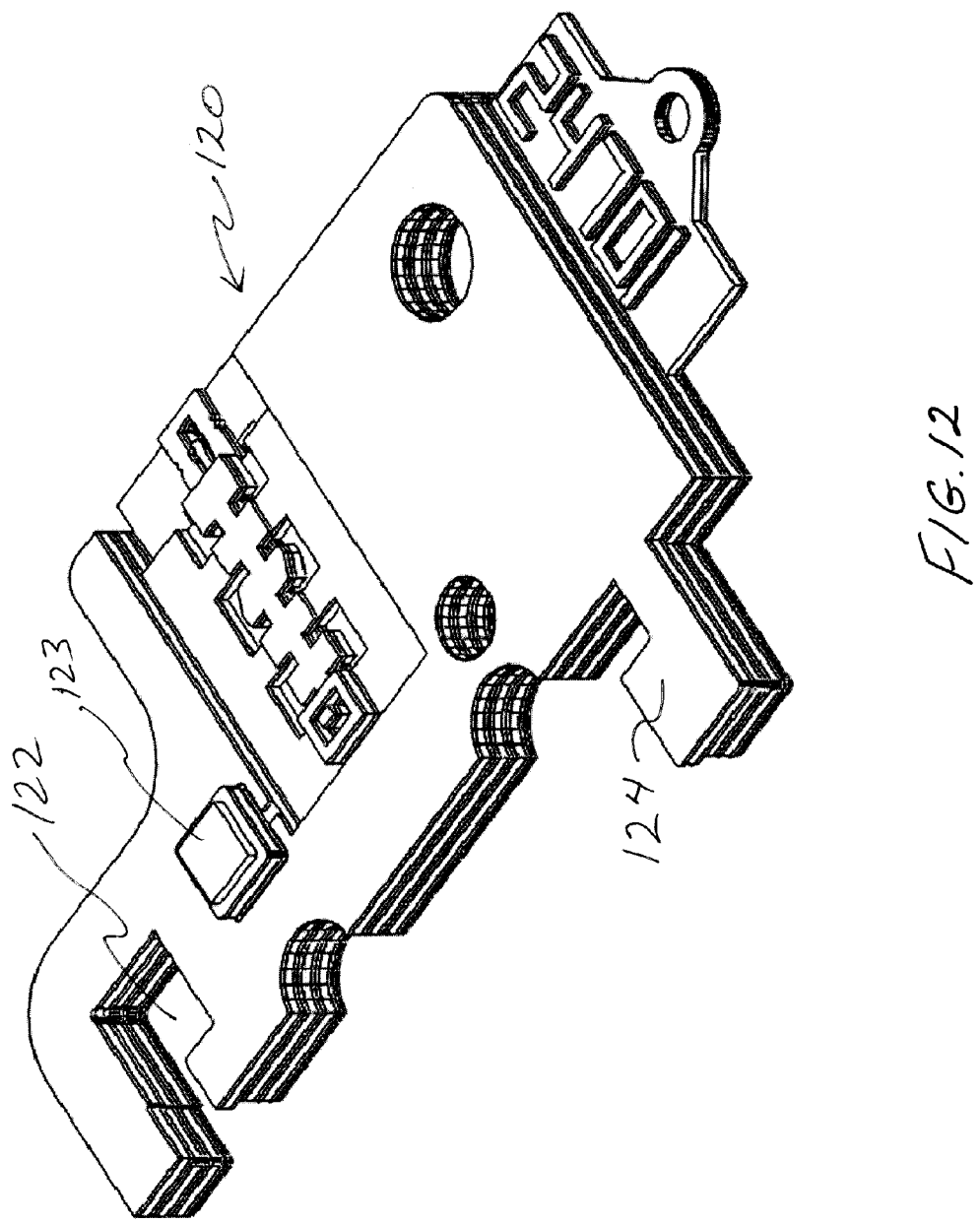
FIG. 12 schematically illustrates an isometric view of an exemplary self-mating, self-aligning substrate-free subsystem for use with a jumper interconnection in accordance with the present invention.
Figure 13:
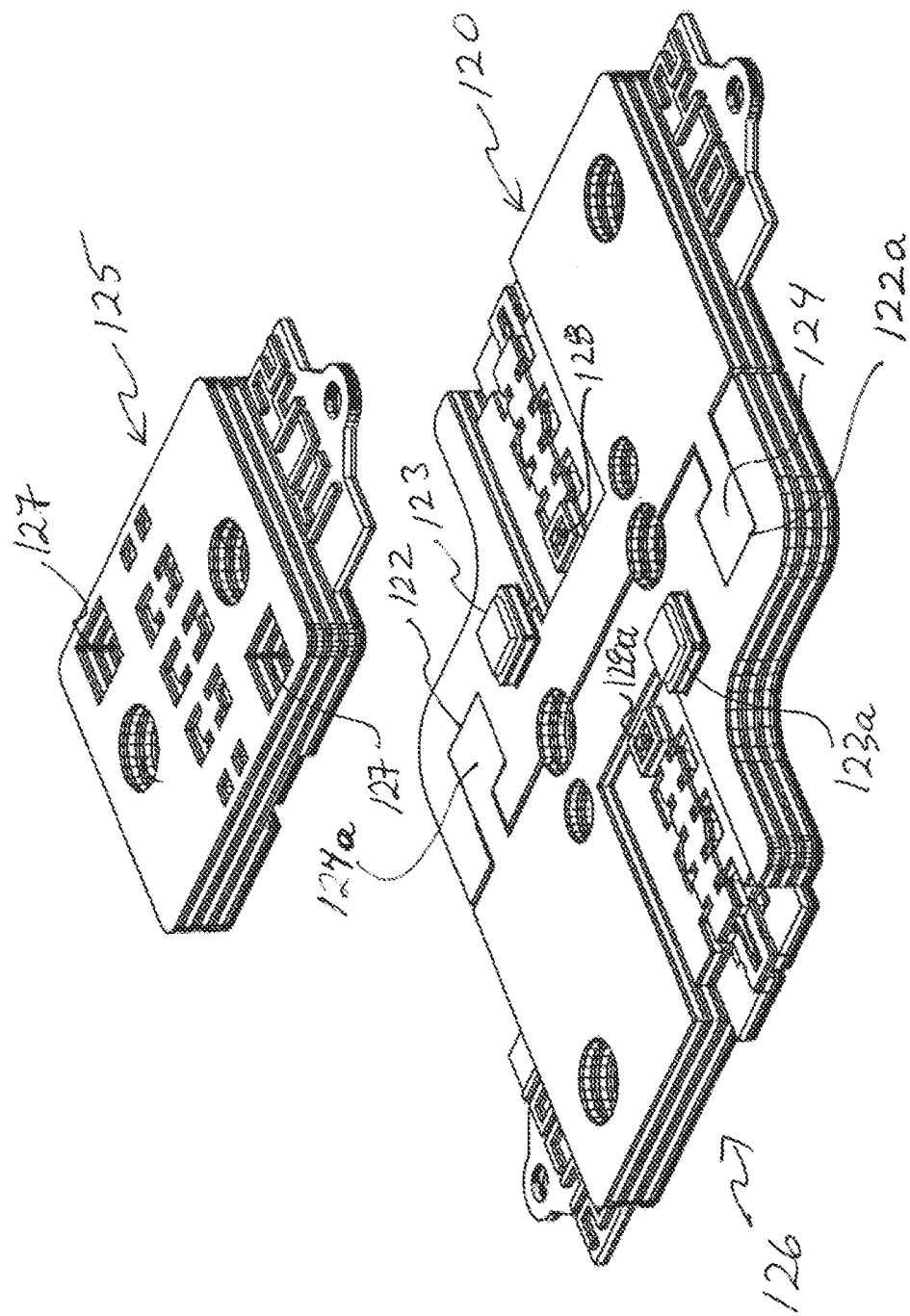
FIG. 13 schematically illustrates an isometric view of the exemplary self-mating subsystem of FIG. 12 with jumper assembly.

Dispensing with male and female interconnection structures may drastically reduce complexity and the required number of parts needed to yield a system or subsystem. Such alignment features would ideally be self-aligning and self-mating. Instead of circular holes, a variety of other shapes would lend themselves to alignment, and could provide directionality, reducing the need for multiple alignment marks across a part. For example, as variously shown in FIGS. 12 and 13, a first and second modules 120, 126 may be provided with a self-mating slots 122, 122*a* and a self-mating tabs 124, 124a, where the tabs 124, 124a are configured to mate with the slots 122, 122a. Such mechanical interlocking features as self-mating slots 122, 122a and tabs 124, 124a can then register input and output ports 128, 128a of the first and second modules 120, 126 in a way that a third planar-subsystem "jumper" 125 may be aligned and bonded in place, FIG. 13. This may be achieved by forming additional monolithic alignment features, such as tapered pins 123, 123a in the same build sequence that forms the in plane alignment between the two planar subsystems to align the first and second modules 120, 126 to tapered holes 127 of the jumper 125, FIG. 13. These additional alignment features in the form of tapered pins 123, 123a, may protrude above the plane containing the first and second modules 120, 126 to precisely register the jumper 125 providing the microwave and DC interconnect function between the ports 128, 128a of the first and second modules 120, 126, FIG. 13.

Figure 14:
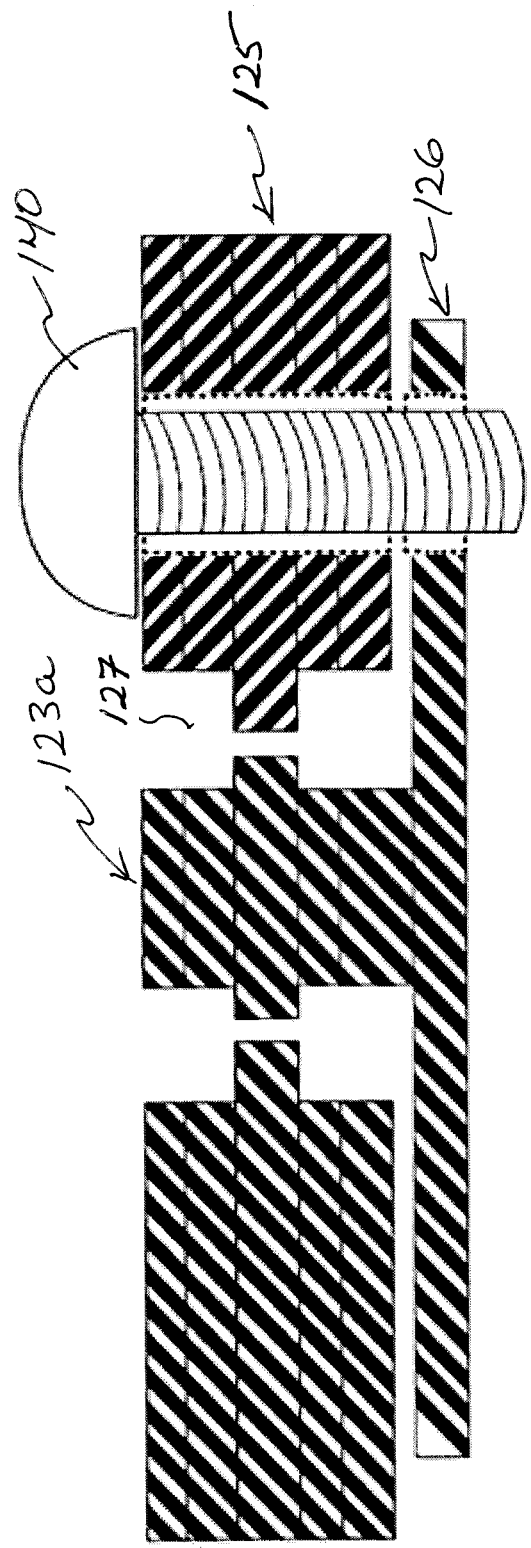
FIG. 14 schematically illustrates an exemplary alignment structure with tight tolerance on a single layer to mitigate layer registration related tolerancing issues in a 2.5-D process.

In a 2.5-D subsystem, layer to layer misalignment, though slight, may necessitate an increase of tolerance on the alignment features, reducing the possible alignment accuracy for interconnections. To mitigate this effect, an approach is to tightly tolerance a single layer and its mate, as shown in FIG. 14. In a layer by layer additive build, the alignment accuracy between the fused layers may be ultimately limited by some mechanism of human and/or machine motion. For example, if the layers are defined using a contact mask aligner, one may be limited by the ability to resolve the edges of alignment features on the wafer and/or the ability to mechanically align and a photomask to those features. Typically such alignments are on the order of +/− several to one micron for very thick layers (such as 100 or more microns thick). Regardless of the way a misalignment might happen, if it does, improved alignment can be achieved by relying on only one layer in each independent piece that is being assembled. In FIG. 14, a first component 126 having a pin 123a may be a part comprised of a layer by layer build, in this case 6 layers are shown each of a determined thickness. A second component 125 may be comprised of 5 layers shown. To more accurately register these two components 125, 126 with respect to each other any layer to layer misalignment introduced in their fabrication (not shown) can be eliminated by using only the 4th layer in component 126 and the 3rd layer in component 125 to achieve the component to component registration, which would be limited to the gap 127 between them. After the components 125, 126 are assembled, component 125 being placed onto 126, they may be locked in place using a screw 140 that threads into a region of component 126 or into a region below component 126.

Figure 16:
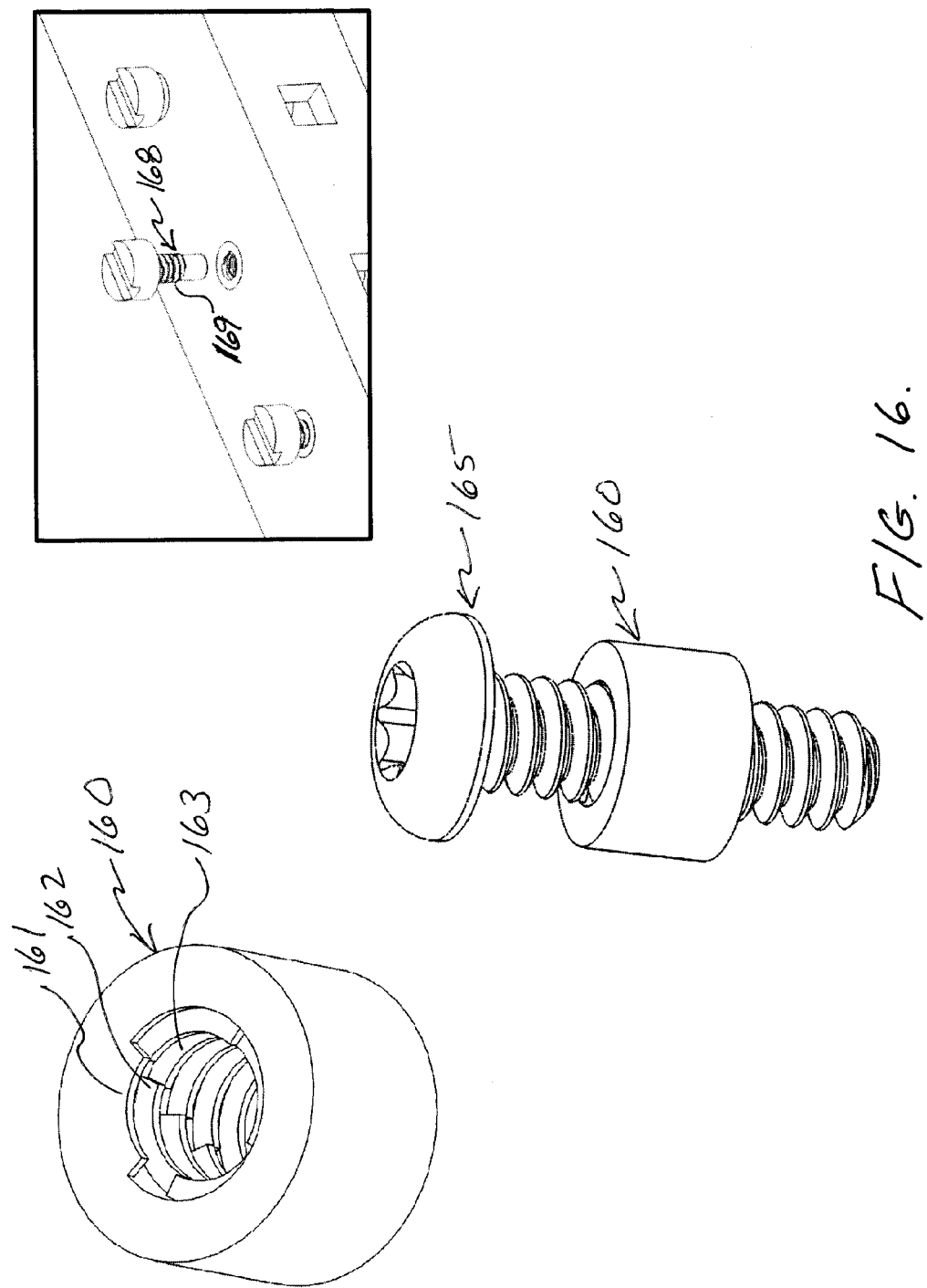
FIG. 16 schematically illustrates isometric views of an exemplary micro-fabricated threaded screws hole (left) using a 2.5D, multi-layer process in accordance with the present invention, a standard screw used with a micro-fabricated threaded hole in accordance with the present invention (center), and a micro-fabricated threaded screw in accordance with the present invention (right)

In a fourth inventive aspect, the present invention may provide the ability to create threaded holes using only a 2.5D build process, FIG. 16. Typically threaded holes follow a continuous screw pattern. However in a 2.5D build, a functionally equivalent structure to a continuous screw pattern can be made normal to the strata planes and also parallel to strata planes. A PolyStrata® threaded hole can be used to attach passive and active devices to PolyStrata® parts and also to attach two PolyStrata® pieces together. The PolyStrata® threaded hole eliminates the need for extra non-PolyStrata® tooling with threaded holes. Unlike normal tapped holes in tooling, the PolyStrata® threaded hole has a photo-lithographically defined diameter and location. Therefore, the PolyStrata® threaded hole can be used for accurate alignment, eliminating the need for extra alignment features either in tooling or in other areas of the PolyStrata® part. If using screws, this may be the lowest weight design for non-permanent attach to substrate free planar subsystems. The left panel in FIG. 16 schematically illustrates an example of stepwise thread holes 160 fabricated normal to the strata plane. Rather than contain a single continuous spiral thread, which is not possible due to the 2.5D nature of a layered build process, individual, planar, circumferential arcs 161, 162, 163 may be disposed in separate strata layers in angular offset locations from one another to approximate a continuous spiral thread in a stepwise- or digitized-manner. The PolyStrata® threaded hole 160 can be used to attach passive and active devices to PolyStrata® parts and also to attach two PolyStrata® pieces together. The PolyStrata® threaded hole 160 eliminates the need for extra non-PolyStrata® tooling to make continuously spiral-threaded holes. For instance, the center panel in FIG. 16 schematically illustrates the use of a standard screw 165 within a stepwise threaded hole 160. In addition the right panel in FIG. 16 schematically illustrates a micro-fabricated stepwise threaded screw 168 comprising circumferential arcs 169 disposed in separate strata layers in angularly offset locations from one another to approximate a continuous spiral thread on the screw 168. This new micro-fabricated threaded hole 160 permits the use of miniature sized screws needed for micro-assembly of parts requiring very-compact form factor. Furthermore, unlike normal tapped holes in tooling, the PolyStrata® threaded hole 160 has a photo-lithographically defined diameter and location. Therefore, the PolyStrata® threaded hole 160 can be used for accurate alignment, eliminating the need for extra alignment features either in tooling or in other areas of the part. By enabling micron level accuracy positioning very sensitive devices such resonators or filters can be fabricated and tune using this microscrews.

Figure 17:
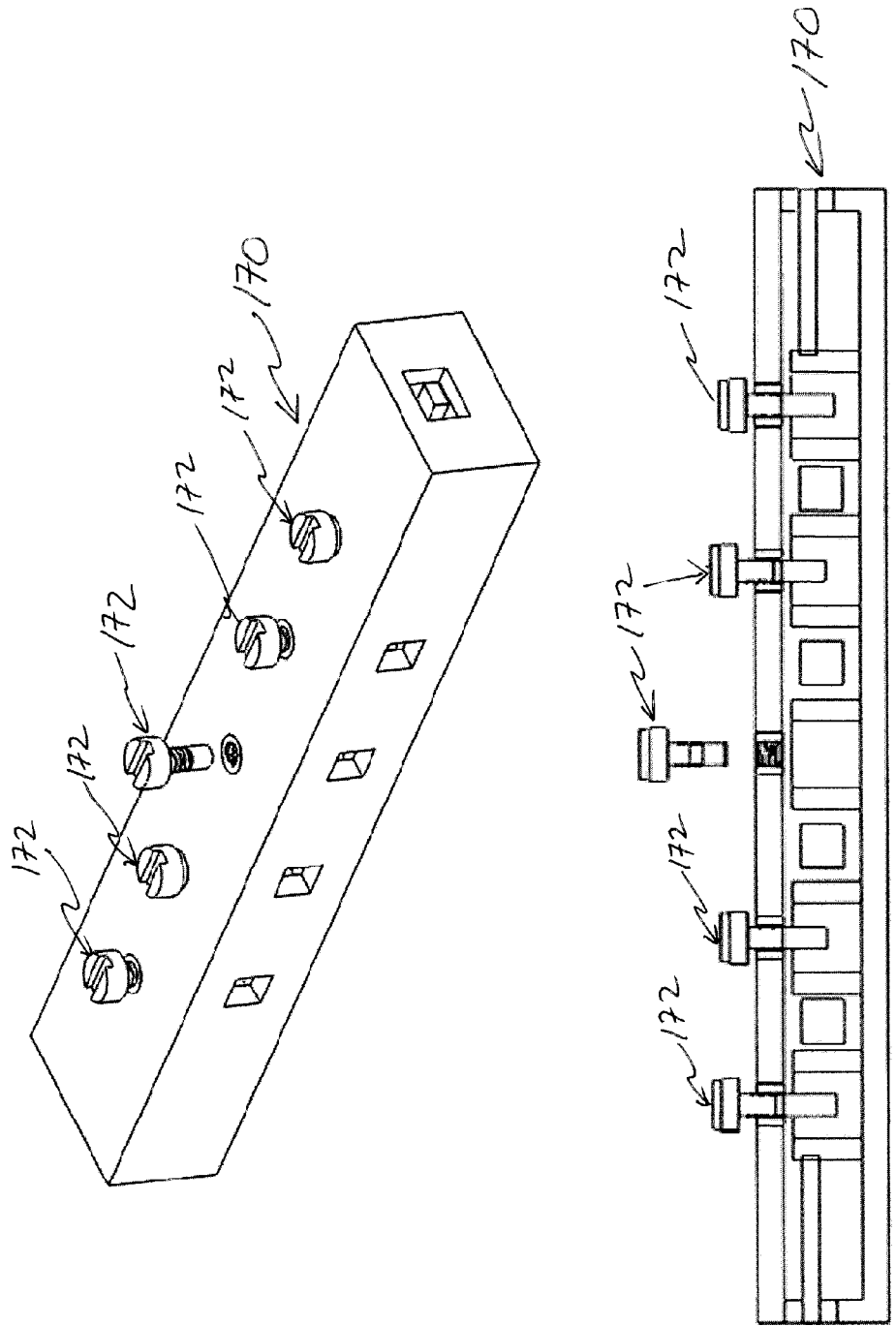
FIG. 17 schematically illustrates an isometric (upper) and side elevation (lower) views of an exemplary micro-fabricated tunable cavity resonator filter integrating PolyStrata® threaded holes and threaded screws in accordance with the present invention.

For example, FIG. 17 schematically illustrates an example of 60 GHz 5-pole cavity filter 170. The dimensions of the cavity are 6 mm in length and 2 mm in width. The microfabricated screws 172 have a diameter of 200 um. Using this novel approach a small tapped screw hole may be realized accurately and the diameter of the thread be positioned with micron scale accuracy. This approach offers re-workability of parts by providing the ability to screw and unscrew the part, as well as tunability and reduced weight due to the small size of the PolyStrata® screws relative to precision standardized miniature screws, typically available off-the-shelf, and usually made by die-turning, lathe, CNC or other precision machining operations.

In a fifth inventive aspect, the present invention may provide a hole-shaped interconnection that permits connection from a coaxial transmission line to any industry standard pin connector 182, 184. FIG. 18 illustrates an interconnection with a 2.4 mm connector, however the design is functionally equivalent when applied to any coaxial connector such as SMA, SSMA, 1.0 mm, 1.85 mm, 2.92, mm or 3.5 mm. In this example, an RF signal can pass through one connector 182; enter the coaxial transmission line of a transition structure 180 and transition back to the second connector 184. FIGS. 19 and 20 schematically illustrate a donut shape transition 187 from a connector pin 186 to the coaxial-line 183 of the transition structure 180. Other shapes could be used to transition such as rectangular or square shape. This hole-shaped connection enables better position accuracy between the connector input pin 186 and the coaxial line 187 than previous approach like standard PC board connectors. Using this transmission module 180, the electrical performance of the transition is improved due to a better mechanical positioning of the pin 186 in relation to the coax line 187. PolyStrata® micro-fabrication or a similar additive build process also offers tighter tolerance resulting in better RF performance and more reproducible results. Such higher performance transition becomes critical for high volume and frequencies above 10 GHz.

The electrical assembly can be performed using solder or conductive epoxy. For certain applications and at certain frequency, it is also possible not to use any solder or conductive adhesive and only rely on capacitive RF coupling to provide the signal interconnection. The performance can be further improved by closing the top of the transition structure 180 with an optional top plate 190, FIG. 21. The top plate 190 may stop any radiation loss due from the pin 186 or the transition 187, significantly reducing the loss.

In a sixth inventive aspect, the present invention may provide a method for utilizing precision fabrication techniques to create solder or epoxy joints with controlled height. This is useful both for filters (setting capacitance), setting the precise height of cavities, and for ensuring good lifetime of a solder or epoxy joint. The height of a solder joint is often a critical element in the lifetime of the joint since it plays a key role in defining the stress that occurs in the solder over time. Utilizing this approach, all solder joints in a system can be designed to have a desired thickness with micron scale accuracy over the entire system.

Figure 22:
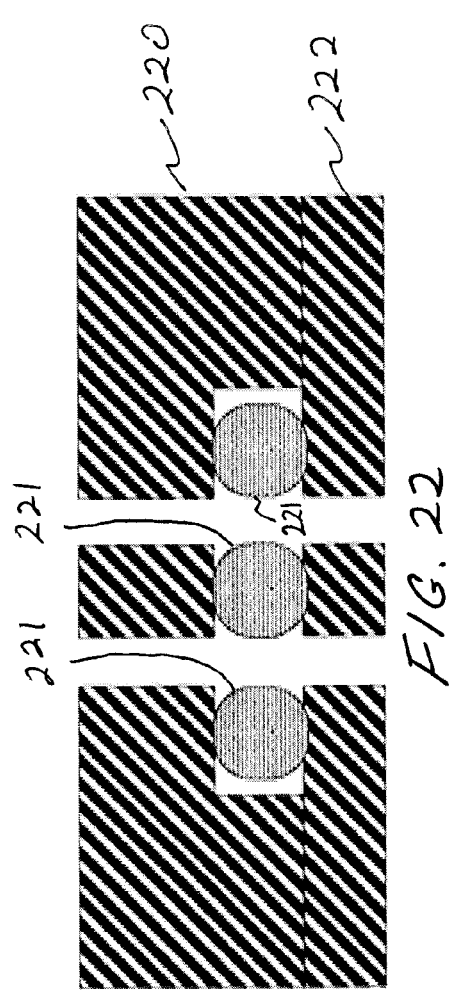
FIG. 22 schematically illustrates a cross-sectional view of an exemplary precise thickness control used as a mechanical stop to control solder bond height in accordance with the present invention.
Figure 23:
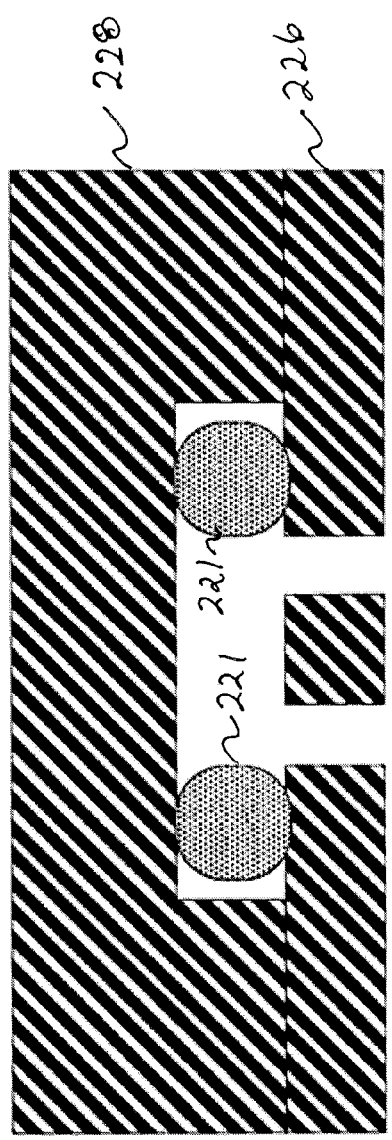
FIG. 23 schematically illustrates a cross-sectional view of an exemplary precise thickness control to control gap height.
Figure 24:
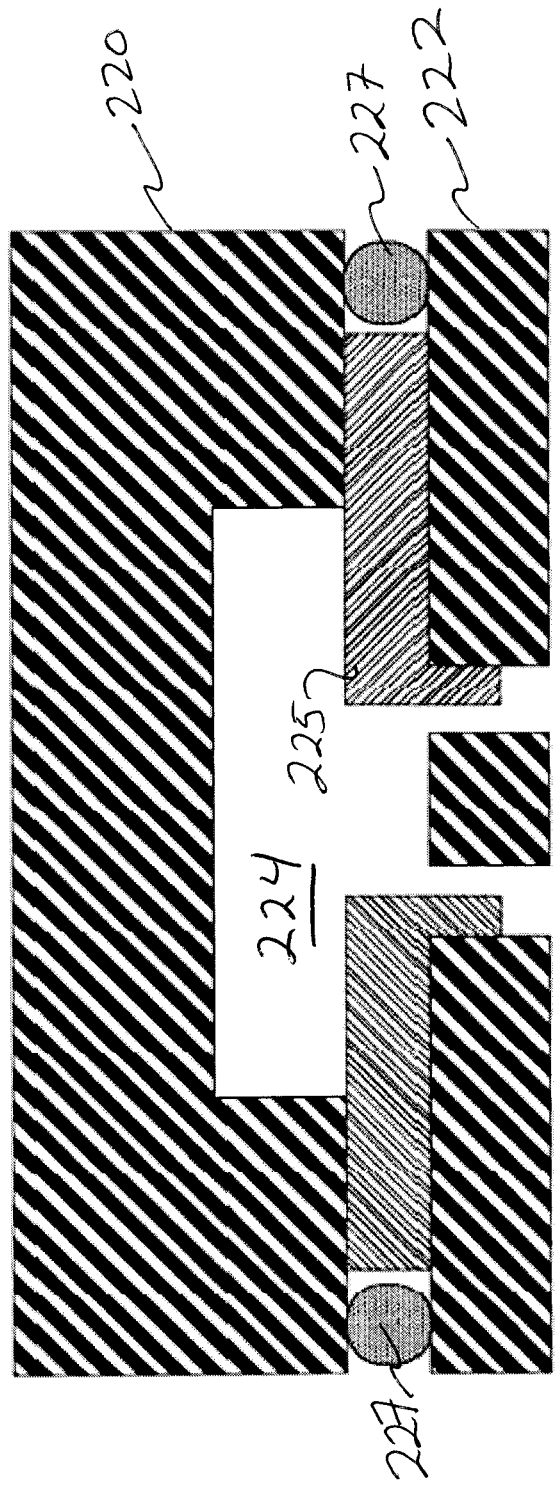
FIG. 24 schematically illustrates a cross-sectional view of the use of an exemplary dielectric gasket to control bondgap height and cavity height, as well as prevent solder flow into the cavity, in accordance with the present invention.
Figure 25:
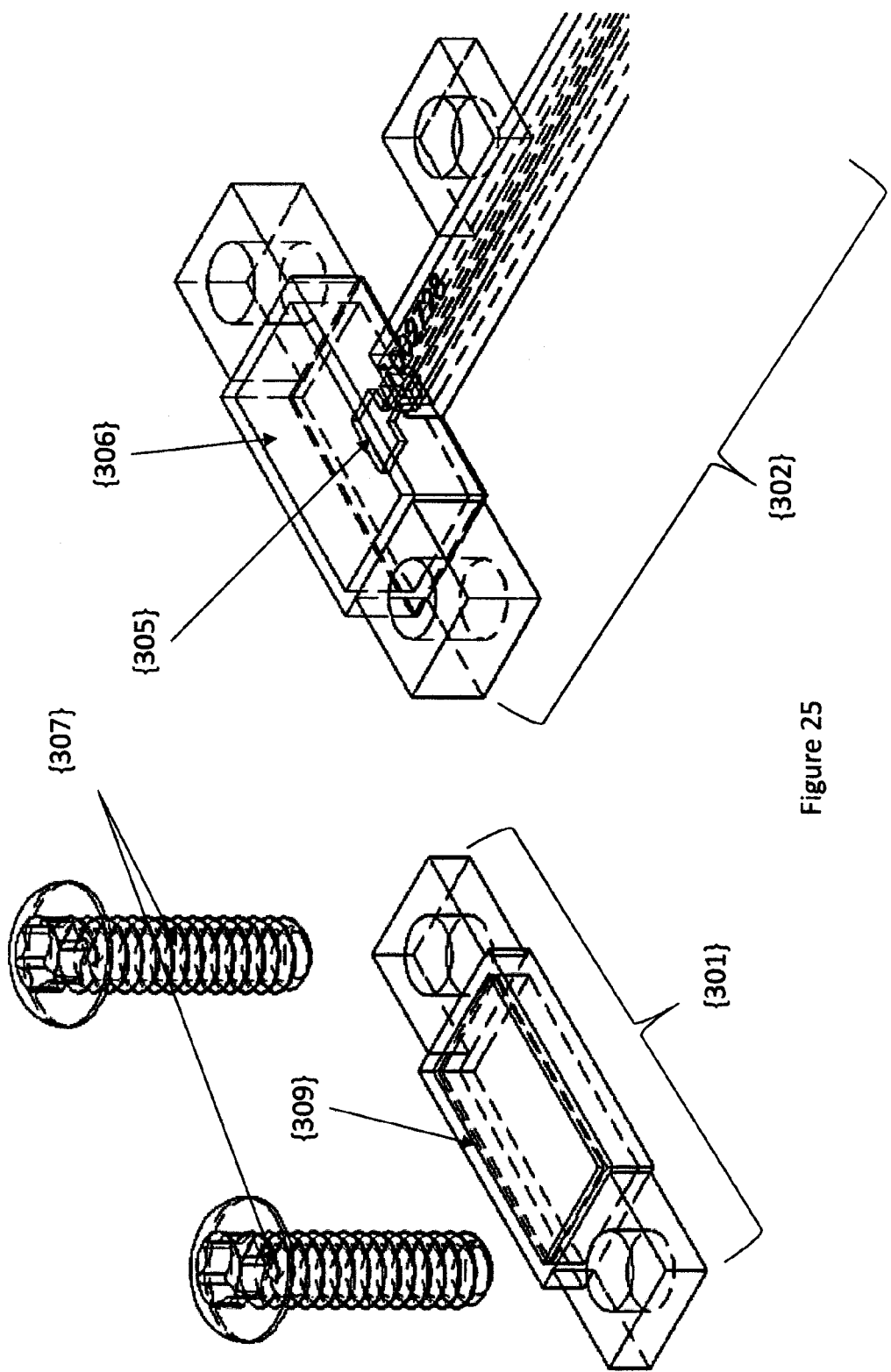
FIG. 25 schematically illustrates the components of a micro-coaxial transition to hollow-core waveguide, an "E-plane backshort" in accordance with the present invention.
Figure 26:
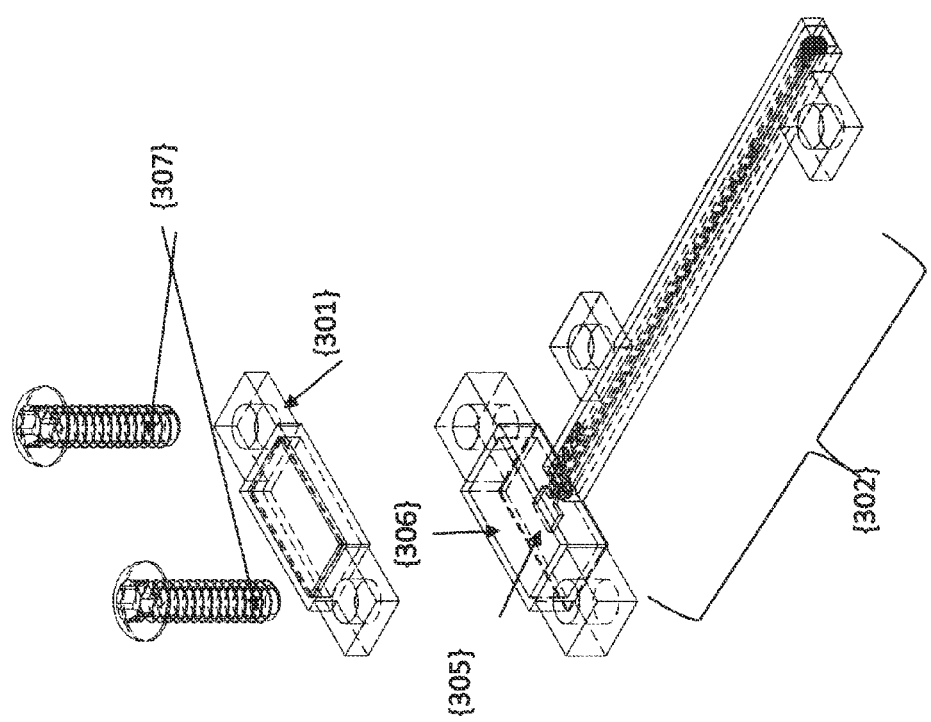
FIG. 26 schematically illustrates an exploded assembly view of the E-plane micro-coaxial transition to hollow-core waveguide for FIG. 25.
Figure 27:
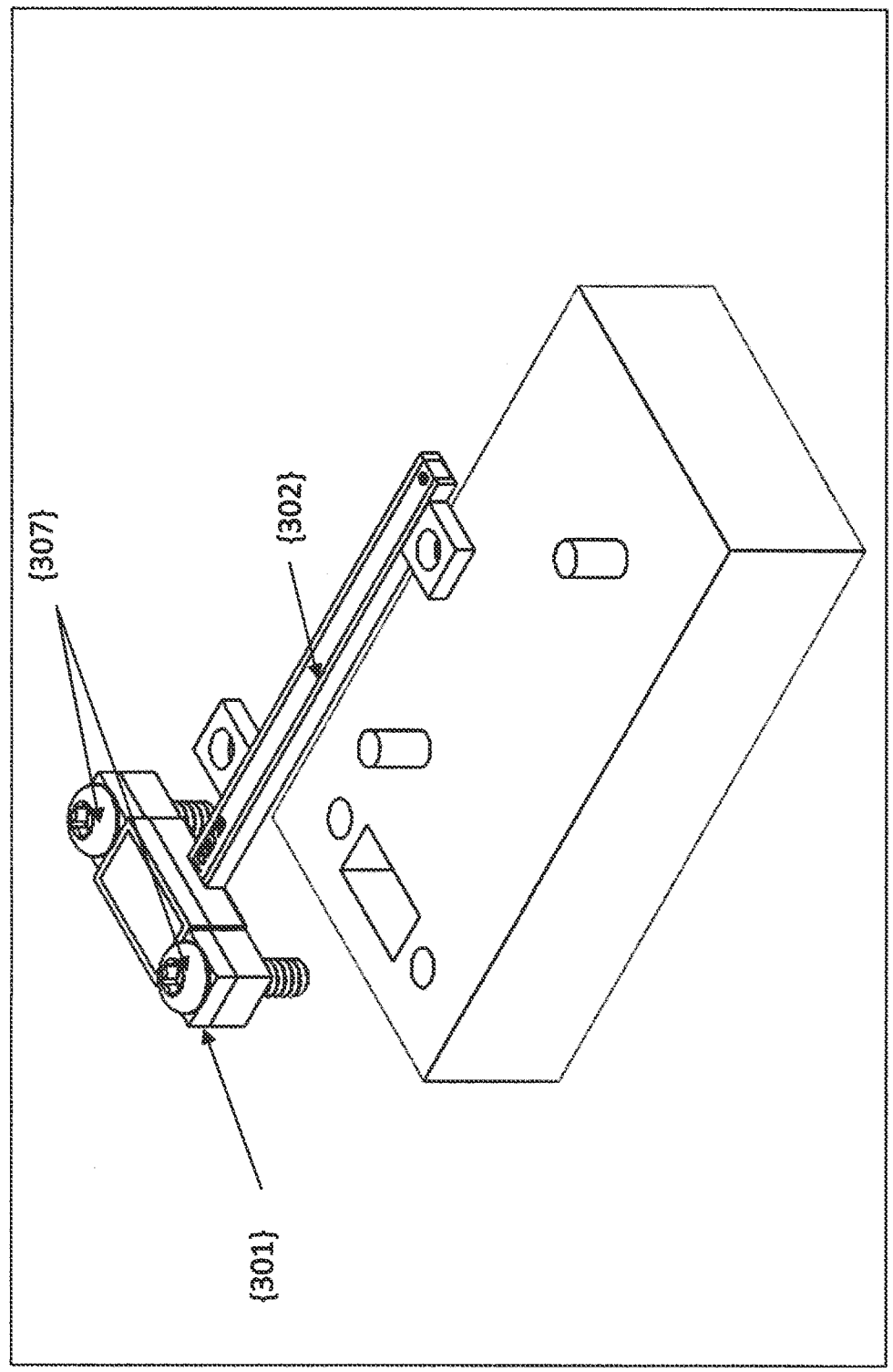
FIG. 27 schematically illustrates the assembled micro-coaxial transition to waveguide and the tool fixture containing hollow-core waveguide to which it mates.
Figure 28:
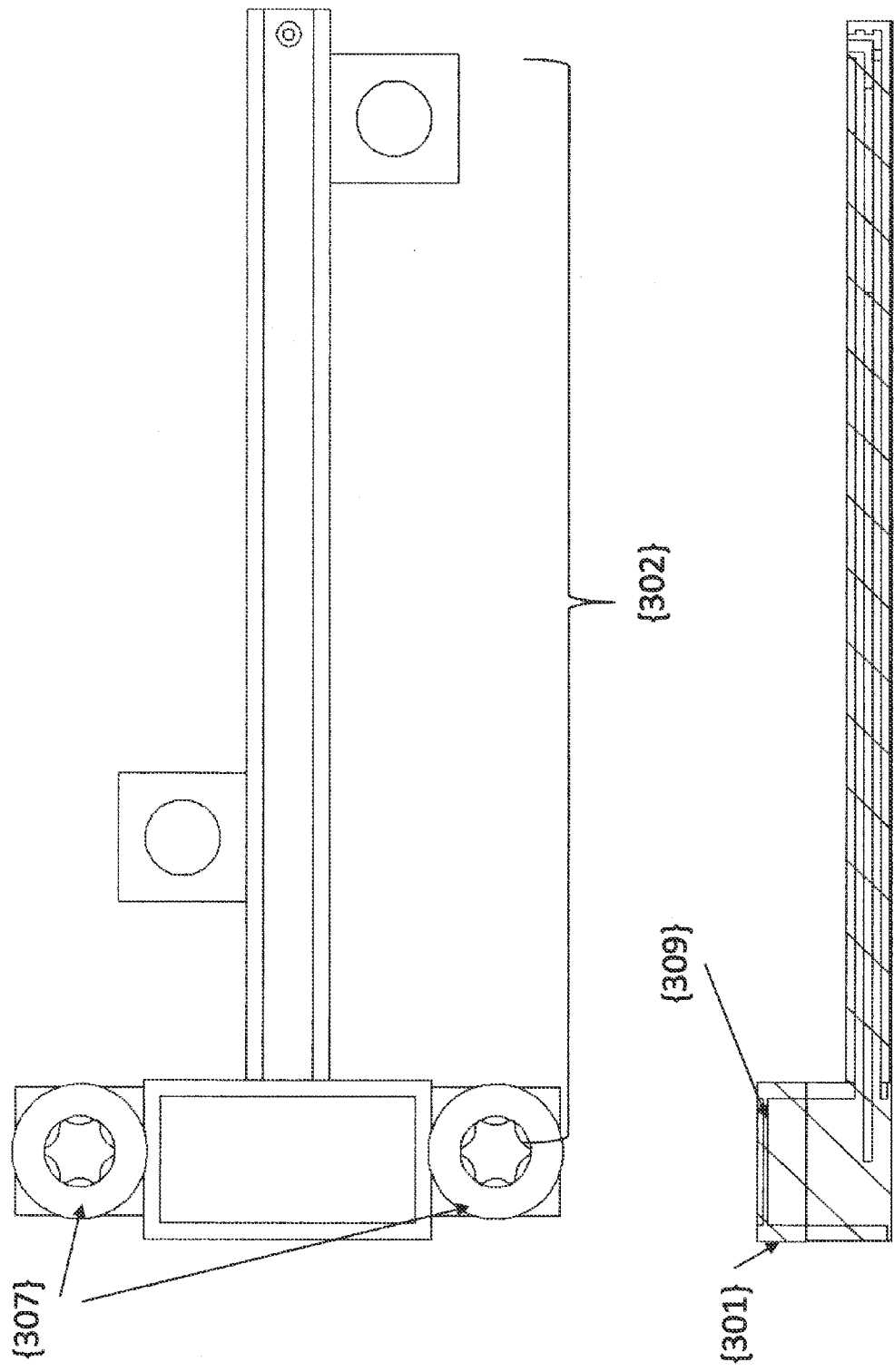
FIG. 28 schematically illustrates a top-down and cross-sectional view of a micro-coaxial transition to hollow-core waveguide of FIG. 25.

In the configuration illustrated in FIG. 22, solder paste 221 may be applied to horizontal PolyStrata® piece 222 before assembly. A vertical PolyStrata® piece 220 may then be aligned and pushed down with sufficient force that the vertical PolyStrata® piece 220 rests against the horizontal piece 222. The solder 221 is then reflowed. During reflow, pressure is continuously applied such that the final thickness of the solder to 21 is set by a value determined by the design of the vertical PolyStrata® piece 220. This same technique to join pieces 226, 228 can be used to create gaps with precise control over the final thickness of the gap as schematically illustrated in FIG. 23. A third exemplary implementation of this concept can be realized utilizing a precision fabricated collar or gasket 225 of incompressible dielectric material. In this configuration, the precise height of the solder bondline 227 is set by a combination of the thicknesses of PolyStrata® pieces 220, 222 and the thickness of the dielectric gasket 225. The dielectric gasket 225 in this instance may also function as a wick-stop or surface-flow stop, preventing solder from entering the cavity 224 and affecting its performance.

In a seventh inventive aspect, the present invention relates to hollow waveguide structures, as follows. While air dielectric coax and strip-line waveguides structures are low loss and support a wide bandwidth, there is currently no known technology that can rival the loss per unit length of hollow waveguide structures. Meanwhile when interfacing to chips, the ability to reduce size and distance associated with other waveguide structures such as coaxial, microstrip, CPW, stripline, and suspended stripline structures, are better able to interface to microchips such as MMICs. It is therefore desirable to be able to move between waveguide structures such as micro-coax and hollow waveguide as needed depending on the function to be achieved in a component, circuit, subsystem, or system. A coaxial mode is transferred into a radiative mode to launch a wave into a hollow waveguide, using what is called an E-probe or an H-probe. These terms are commonly known in the art and refer to the electric or magnetic field orientation of the transition structure and hollow waveguide. These transition structures are increasingly sensitive to fabricated and assembled dimensions and tolerances with increasing frequency. Thus we present techniques applicable to a 2.5D or 3D fabrication processes to enable their integration and incorporation with the tolerances and precision required. They are particularly useful as frequency moves to mm-wave and sub-mm wave frequencies such as 60, 70, 100, 200 GHz or more.

FIGS. 25-28 show an example of the use of two parts fabricated in the PolyStrata® process, and two screws used for assembly 307. Component 301 is referred to as the back-short lid. Component 302 is a region of waveguide for a wave propagating up the page into the hollow waveguide cavity region 306. The wave is converted to and from a coaxial waveguide mode using e-probe transition feature 305 which becomes part of the center conductor of the coax, the outer conductor of which exits to the right of the page. The lid 301 is placed on the waveguide to coax transition 302 and the parts are in continuous electrical connection using compression applied by the screws once assembled.

These and other advantages of the present invention will be apparent to those skilled in the art from the foregoing specification. Accordingly, it will be recognized by those skilled in the art that changes or modifications may be made to the above-described embodiments without departing from the broad inventive concepts of the invention. It should therefore be understood that this invention is not limited to the particular embodiments described herein, but is intended to include all changes and modifications that are within the scope and spirit of the invention as set forth in the claims.

What is claimed is:

1. A three-dimensional microstructure, comprising:
a first microstructural coaxial waveguide element comprising one or more layers of material, the first microstructural waveguide element comprising an outer conductor, a center conductor, and a plurality of non-conductive supports configured to support the center conductor within the outer conductor and comprising a mating end at which the center conductor extends beyond the length of the outer conductor, wherein one or more of the outer conductor, center conductor, and non-conductive supports comprises a plurality of the layers of material; and
a second microstructural coaxial waveguide element comprising one or more layers of material, the second microstructural coaxial waveguide element comprising an outer conductor, a center conductor and comprising a mating end complementary to the mating end of the first microstructural coaxial waveguide element and configured to receive the mating end of the first microstructural coaxial waveguide element and configured to electrically couple the respective center conductors of the first and second microstructural coaxial waveguide elements and configured to electrically couple the respective outer conductors of the first and second microstructural coaxial waveguide elements, wherein one or more of the outer conductor, center conductor, and non-conductive supports of the second microstructural coaxial waveguide element comprises a plurality of the layers of material.

2. The three-dimensional microstructure according to claim 1, wherein the mating ends of the center conductors of the first and second coaxial waveguide elements are configured to deflect with a cantilever motion upon contact therebetween.

3. The three-dimensional microstructure according to claim 1, wherein the mating end of the second microstructural coaxial waveguide element comprises an annular shape for receiving the center conductor of the first microstructural coaxial waveguide element complementarily.

4. The three-dimensional microstructure according to claim 1, wherein the second microstructural coaxial waveguide element comprises a plurality of non-conductive supports configured to support the center conductor of the second microstructural coaxial waveguide element within the outer conductor of the second microstructural coaxial waveguide element.

5. A three-dimensional microstructure, comprising:

A first microstructural coaxial waveguide element comprising one or more layers of material, the first microstructural coaxial waveguide element comprising an outer conductor, a center conductor, and a plurality of non-conductive supports configured to support the center conductor within the outer conductor and comprising a mating end at which the center conductor extends beyond the length of the outer conductor, wherein one or more of the outer conductor, center conductor, and non-conductive supports comprises a plurality of the layers of material; and;

a second microstructural coaxial waveguide element comprising one or more layers of material, the second microstructural coaxial waveguide element comprising an outer conductor, a center conductor, and comprising a mating end configured to receive the mating end of the first microstructural coaxial waveguide element and configured to electrically couple the respective center conductors of the first and second microstructural coaxial elements and configured to electrically couple the respective outer conductors of the first and second microstructural coaxial waveguide elements, wherein one or more of the outer conductor, the center conductor, and non-conductive supports of the second microstructural coaxial waveguide element comprises a plurality of the layers of material;

wherein the mating ends of the first and second microstructural coaxial waveguide elements are configured to permit the first and second microstructural coaxial waveguide elements to be orthogonally connected.

6. A method of forming a three-dimensional microstructure by a sequential build process, comprising:

depositing a plurality of layers over a substrate having a planar region, wherein the plurality of layers comprise one or more of a metal material, and a dielectric material, thereby forming a structure above the substrate, comprising a first microstructural coaxial waveguide element, the first microstructural coaxial waveguide element comprising an outer conductor, a center conductor, and a plurality of non-conductive supports configured to support the center conductor within the outer conductor and comprising a mating end at which the center conductor extends beyond the length of the outer conductor;

a second microstructural coaxial waveguide element, the second microstructural coaxial waveguide element comprising an outer conductor, a center conductor and comprising a mating end complementary to the mating end of the first microstructural coaxial waveguide element and configured to receive the mating end of the first microstructural coaxial waveguide element and configured to electrically couple the respective center conductors of the first and second microstructural coaxial waveguide elements and configured to electrically couple the respective outer conductors of the first and second microstructural coaxial waveguide elements.

7. The method according to claim 6, wherein the plurality of layers comprises a sacrificial material, and wherein the method includes the step of removing the sacrificial material.

8. The method according to claim 6, wherein the mating ends of the center conductors of the first and second coaxial waveguide elements are configured to deflect with a cantilever motion upon contact therebetween.

9. The method according to claim 6, wherein the mating end of the second microstructural coaxial waveguide element comprises an annular shape for receiving the center conductor of the first microstructural coaxial waveguide element complementarily.

10. The method according to claim 6, wherein the second microstructural coaxial waveguide element comprises a plurality of non-conductive supports configured to support the center conductor of the second microstructural coaxial waveguide element within the outer conductor of the second microstructural coaxial waveguide element.

11. A method of forming a three dimensional microstructure by a sequential build process, comprising:

depositing a plurality of layers over a substrate having a planar region, wherein the layers comprise one or more of a metal material, and a dielectric material, thereby forming a structure above the substrate, comprising a first microstructural coaxial waveguide element, the first microstructural coaxial element comprising an outer conductor, a center conductor, and a plurality of non-conductive supports configured to support the center conductor within the outer conductor and comprising a mating end at which the center conductor extends beyond the length of the outer conductor;

a second microstructural coaxial waveguide element, the second microstructural coaxial waveguide element comprising an outer conductor, a center conductor and comprising a mating end configured to receive the mating end of the first microstructural coaxial waveguide element and configured to electrically couple the respective center conductors of the first and second microstructural coaxial waveguide elements and configured to electrically couple the respective outer conductors of the first and second microstructural coaxial waveguides, wherein the mating ends of the first and second microstructural coaxial waveguide elements are configured to permit the first and second microstructural coaxial waveguide elements to be orthogonally connected.

12. A three-dimensional microstructure, comprising:

a microstructural base element comprising one or more layers of material including a chip socket disposed therein for receiving a chip and including one or more base registration features; and a microstructural lid element comprising one or more layers of material, the lid element configured to mate to the base element, the lid element including one or more lid registration features for registration with the base registration features and including a plurality of biasing members disposed at a location relative to the lid registration features so as be located in opposition to the chip socket upon registration of the base and lid elements, whereby a chip disposed in the chip socket may be electrically and/or mechanically interconnected to the base and lid elements by the biasing members.

13. The three-dimensional microstructure according to claim 12, wherein the biasing members comprise cantilevered fingers.

14. A method of forming a three-dimensional microstructure by a sequential build process, comprising:

depositing a plurality of layers over a substrate having a planar region, wherein the plurality of layers comprise one or more of a metal material, and a dielectric material, thereby forming a structure above the substrate, comprising
  a microstructural base element including a chip socket disposed therein for receiving a chip and including one or more base registration features;
  a microstructural lid element configured to mate to the base element, the lid element including one or more lid registration features for registration with the base registration features and including a plurality of biasing members disposed at a location relative to the lid registration features so as be located in opposition to the chip socket upon registration of the base and lid elements, whereby a chip disposed in the chip socket may be electrically and/or mechanically interconnected to the base and lid elements by the biasing members.

15. The method according to claim 14, wherein the plurality of layers comprises a sacrificial material, and wherein the method includes the step of removing the sacrificial material.

16. The method according to claim 14, wherein the biasing members comprise cantilevered fingers.

\* \* \* \* \*